US012584028B2

(12) United States Patent
Amako

(10) Patent No.: US 12,584,028 B2
(45) Date of Patent: Mar. 24, 2026

(54) CURABLE ORGANOPOLYSILOXANE COMPOSITION, AND OPTICAL MEMBER FORMED FROM CURED PRODUCT OF SAME

(71) Applicant: DOW TORAY CO., LTD., Tokyo (JP)

(72) Inventor: Masaaki Amako, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 996 days.

(21) Appl. No.: 17/613,619

(22) PCT Filed: May 19, 2020

(86) PCT No.: PCT/JP2020/019726

§ 371 (c)(1),
(2) Date: Nov. 23, 2021

(87) PCT Pub. No.: WO2020/241369

PCT Pub. Date: Dec. 3, 2020

(65) Prior Publication Data

US 2022/0235181 A1 Jul. 28, 2022

(30) Foreign Application Priority Data

May 31, 2019 (JP) ................................ 2019-102546

(51) Int. Cl.

| | |
|---|---|
| ***C08G 77/44*** | (2006.01) |
| ***C08K 3/22*** | (2006.01) |
| ***C08K 3/36*** | (2006.01) |
| ***C09D 7/61*** | (2018.01) |
| *H10K 50/842* | (2023.01) |

(52) U.S. Cl.

CPC ............... *C09D 7/61* (2018.01); *C08G 77/44* (2013.01); *C08K 3/22* (2013.01); *C08K 3/36* (2013.01); *C08K 2003/2227* (2013.01); *C08K 2003/2237* (2013.01); *H10K 50/8426* (2023.02)

(58) Field of Classification Search

CPC . C08G 77/44; C08K 3/22; C08K 3/36; C08K 2003/2227; C08K 2003/2237

USPC .......................................................... 524/413

See application file for complete search history.

(56) References Cited

U.S. PATENT DOCUMENTS

| | | | | |
|---|---|---|---|---|
| 5,932,145 | A * | 8/1999 | Mitani .................... | C08L 83/04 524/439 |
| 6,376,635 | B1 | 4/2002 | Amako et al. | |
| 6,433,057 | B1 * | 8/2002 | Bhagwagar ............ | C09J 183/04 524/588 |
| 2003/0229174 | A1 * | 12/2003 | Goto ....................... | C08L 83/04 524/588 |
| 2006/0079634 | A1 * | 4/2006 | Horikoshi ............... | C08L 83/14 524/588 |
| 2009/0253846 | A1 * | 10/2009 | Fukui ...................... | C08L 83/04 524/430 |
| 2013/0197139 | A1 | 8/2013 | Kobayashi et al. | |
| 2013/0274398 | A1 | 10/2013 | Shiobara et al. | |
| 2015/0115311 | A1 | 4/2015 | Yoshida et al. | |
| 2017/0114220 | A1 | 4/2017 | Kusunoki et al. | |
| 2019/0085167 | A1 | 3/2019 | Iwata | |
| 2019/0292349 | A1 | 9/2019 | Ito | |

FOREIGN PATENT DOCUMENTS

| | | | |
|---|---|---|---|
| EP | 2270100 | A1 | 1/2011 |
| JP | 2010018662 | A | 1/2010 |
| JP | 2011184625 | A | 9/2011 |
| JP | 2012167253 | A | 9/2012 |
| JP | 2013221075 | A | 10/2013 |
| JP | 2013232580 | A | 11/2013 |
| JP | 2015129213 | A | 7/2015 |
| JP | 2016049764 | A | 4/2016 |
| JP | 2016103576 | A | 6/2016 |
| JP | 2017078141 | A | 4/2017 |
| JP | 2017165791 | A | 9/2017 |
| JP | 2017210518 | A | 11/2017 |

(Continued)

OTHER PUBLICATIONS

Machine assisted English translation of WO2017183800A1 obtained from https://worldwide.espacenet.com/patent on Jun. 6, 2023, 17 pages.
English translation of International Search Report for PCT/JP2020/019726 dated Aug. 11, 2020, 2 pages.
Machine assisted English translation of JP2010018662A obtained from https://patents.google.com/patent on Nov. 19, 2021, 9 pages.
Machine assisted English translation of JP2011184625A obtained from https://patents.google.com/patent on Nov. 19, 2021, 11 pages.
Machine assisted English translation of JP2012167253A obtained from https://patents.google.com/patent on Nov. 19, 2021, 9 pages.

(Continued)

*Primary Examiner* — Kelechi C Egwim
(74) *Attorney, Agent, or Firm* — Warner Norcross + Judd LLP

(57) ABSTRACT

Provided herein is a light diffusing material having excellent light transmittance, light diffusion properties, and mechanical properties. The light diffusing material comprises a curable organopolysiloxane composition, comprising: A) an organopolysiloxane having reactive groups; B) one or more inorganic fillers; and C) an organosilicon compound different from component A), and comprising component(s) C1) and/or C2). Component C1) is an organosilicon compound having a reactive functional group that can bond with component A), a hydrolyzable silyl group and/or a silicon atom-bonded hydroxyl group, and two or more silicon atoms, in the molecule. Component C2) is an organosilicon compound having a reactive functional group with three or more carbon atoms, which can bond with component A), a hydrolyzable silyl group and/or a silicon atom-bonded hydroxyl group, and one or more silicon atoms, in the molecule. The mass of component B) is 30 to 95% relative to the mass of the overall composition.

16 Claims, 1 Drawing Sheet

(56) References Cited

FOREIGN PATENT DOCUMENTS

| | | | |
|---|---|---|---|
| JP | 2018009089 | A | 1/2018 |
| JP | 2018012809 | A | 1/2018 |
| WO | 2007001039 | A1 | 1/2007 |
| WO | 2015083839 | A1 | 6/2015 |
| WO | 2016038836 | A1 | 3/2016 |
| WO | 2017183800 | A1 | 10/2017 |

OTHER PUBLICATIONS

Machine assisted English translation of JP2015129213A obtained from https://patents.google.com/patent on Nov. 19, 2021, 9 pages.

Machine assisted English translation of JP2016049764A obtained from https://patents.google.com/patent on Nov. 19, 2021, 12 pages.

Machine assisted English translation of WO2015083839A1 obtained from https://patents.google.com/patent on Nov. 19, 2021, 9 pages.

Machine assisted English translation of JP2016103576A obtained from https://patents.google.com/patent on Nov. 22, 2021, 12 pages.

Machine assisted English translation of JP2018009089A obtained from https://patents.google.com/patent on Nov. 22, 2021, 12 pages.

Machine assisted English translation of JP2018012809A obtained from https://patents.google.com/patent on Nov. 22, 2021, 8 pages.

Machine assisted English translation of WO2016038836A1 obtained from https://patents.google.com/patent on Nov. 22, 2021, 20 pages.

* cited by examiner

【FIG. 1】
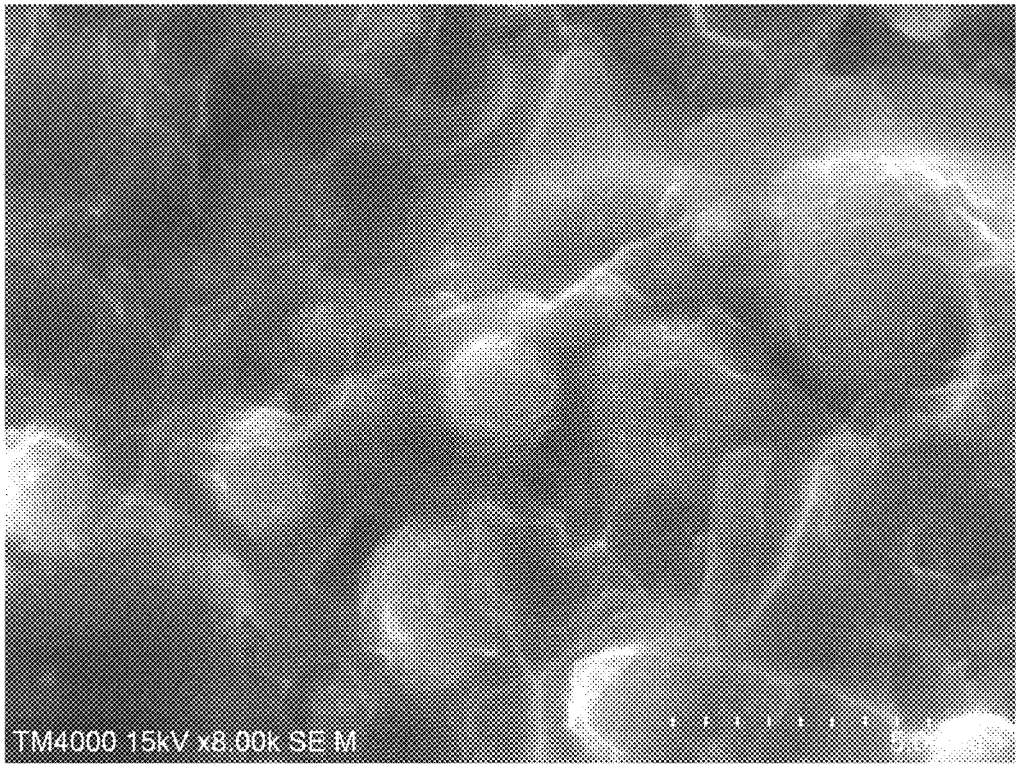
【FIG. 2】
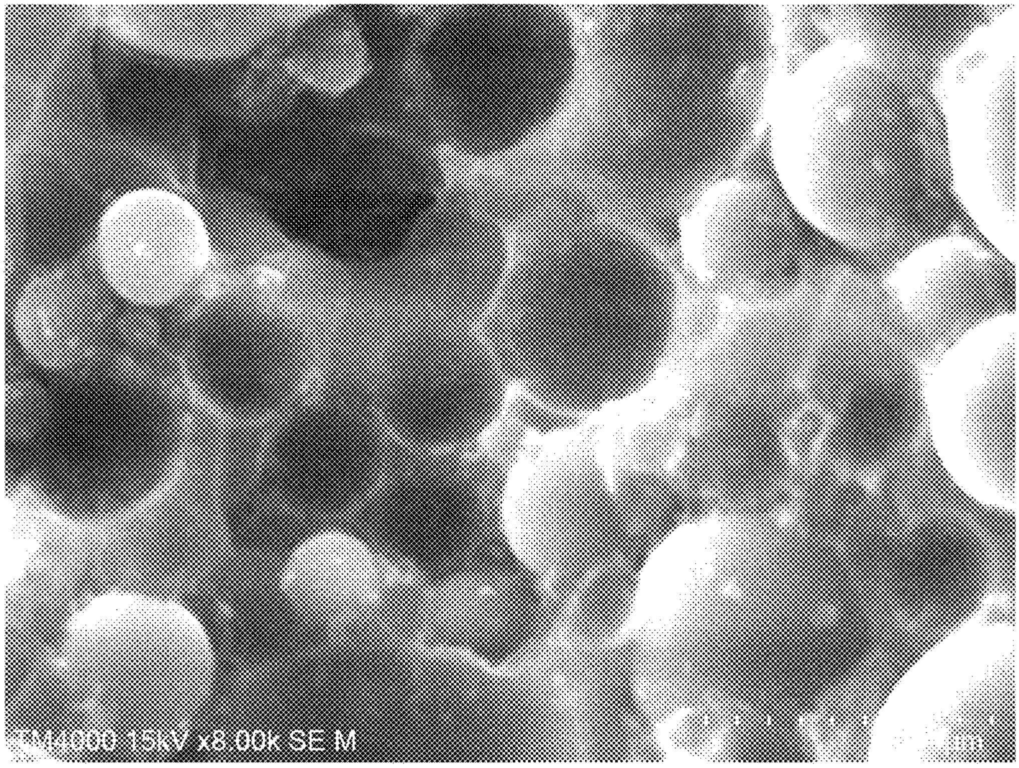

CURABLE ORGANOPOLYSILOXANE COMPOSITION, AND OPTICAL MEMBER FORMED FROM CURED PRODUCT OF SAME

CROSS-REFERENCE TO RELATED APPLICATIONS

This application is the National Stage of International Appl. No. PCT/JP2020/019726 filed on 19 May 2020, which claims priority to and all advantages of Japanese Appl. No. 2019-102546 filed on 31 May 2019, the content of which is hereby incorporated by reference.

TECHNICAL FIELD

The present invention relates to: a curable organopolysiloxane composition that includes: (i) an organopolysiloxane having a reactive group and a proportion of 10 mol % or more of aryl groups of the overall organic groups bonded to silicon atoms in the molecule; (ii) one or more inorganic fillers; and (iii) one or compounds selected from an organosilicon compound (which has a functional group (capable of reacting with the reactive group contained in the organopolysiloxane) and a hydrolyzable silyl group and/or a SiOH group, in addition to having two or more silicon atoms per molecule) and an organosilicon compound (which has a reactive functional group (having three or more carbon atoms (capable of reacting with the reactive group contained in the organopolysiloxane)) and a hydrolyzable silyl group and/or a silicon atom-bonded hydroxyl group, in addition to having one or more silicon atoms per molecule), wherein the content of the inorganic filler is 30 to 95% by mass of the overall composition, a material obtained by curing the curable organopolysiloxane composition, particularly a material exhibiting light diffusion properties, and an optical member formed from the same.

BACKGROUND ART

It is known to use a light diffusing resin composition in order to make light from a light source uniform and eliminate the unevenness of light from lighting, LCD backlights, etc., or to increase the diffuse reflectance of light and enhance the intensity of illumination. It is known to use a composition in which silicone is used as a matrix component as a light diffusing resin composition. It is known that a silicone resin composition is used for optical members including such a light diffusing resin composition. For example, JP 2010-18662 A describes the use of a silicone resin composition which includes silica and can be cured by a hydrosilylation reaction. JP 2011-184625 A describes a light diffusing dimethyl silicone rubber composition which includes, as a light diffusing resin composition, inorganic fillers (such as dimethylpolysiloxane and finely powdered silica), and silicone elastic particles including phenyl group-containing siloxane units. JP 2012-167253 A describes a light diffusing dimethyl silicone rubber composition which includes a crosslinkable dimethyl silicone rubber, an inorganic filler, and, as desired, a dispersing agent (wetter). Further, JP 2015-129213 A describes: an addition-curable silicone rubber composition which includes an alkenyl group-containing straight-chain polyorganosiloxane, an alkenyl group-containing MT or MQ or MTQ resin, a polyorganohydrogensiloxane, and a hydrosilylation catalyst, and further includes 0.1 to 10 parts by mass of spherical silica (relative to 100 parts by mass of the composition) having an average particle size of 0.2 to 10 μm; and a light diffusing silicone rubber obtained by the composition. Moreover, JP 2016-49764 A describes an optical semiconductor element sealing composition which includes: a hydrosilylation curable silicone composition and phosphor having a phenyl group; and light diffusing organic particles selected from crosslinked polymethyl methacrylate particles and crosslinked polystyrene particles.

PRIOR ART DOCUMENTS

Patent Documents

Patent Document 1: JP 2010-18662 A
Patent Document 2: JP 2011-184625 A
Patent Document 3: JP 2012-167253 A
Patent Document 4: JP 2015-129213 A
Patent Document 5: JP 2016-49764 A

SUMMARY OF THE INVENTION

Problems to be Solved by the Invention

However, a new light diffusing material, etc. with excellent light transmittance, light diffusion properties, and mechanical properties is currently also sought. In addition to these properties, there is also a need for a highly durable light diffusing material in a reflow soldering step. The present invention seeks to provide a curable organopolysiloxane composition capable of obtaining a cured product which can be used as a light diffusing material having excellent balance between these properties. Moreover, the present invention seeks to provide a curable organopolysiloxane composition which can be widely used in optical members, including materials for use in a sealing agent for increasing the light extraction efficiency from a light emitting device such as a light emitting diode (LED).

Means for Solving the Problems

The curable organopolysiloxane composition according to the present invention contains one or more types of compounds selected from the group consisting of the following components A to C:

A) an organopolysiloxane having, in the molecule, at least two radical reactive groups and/or a reactive group capable of crosslinking via a hydrosilylation reaction, wherein at least 10 mol % of the overall organic groups bonded to silicon atoms in the molecule are aryl groups;

B) one or more inorganic fillers; and

C) an organosilicon compound different from component A, the organosilicon compound comprising the following C1 and C2:

C1) an organosilicon compound different from component A, the organosilicon compound having: a reactive functional group capable of bonding to a reactive group contained in component A; and a hydrolyzable silyl group and/or a silicon atom-bonded hydroxyl group, in addition to having two or more silicon atoms in the molecule; and C2) an organosilicon compound different from component A, the organosilicon compound having: a reactive functional group having three or more carbon atoms capable of bonding to a reactive group contained in component A; and a hydrolyzable silyl group and/or a silicon atom-bonded hydroxyl group, in addition to having one or more silicon atoms in the molecule, wherein the mass of component B is 30 to 95% relative to the mass of the overall composition.

Here, an organic group bonded to a silicon atom (silicon atom-bonded organic group) refers to an organic group bonded to a silicon atom forming the polyorganosiloxane, such as a radical reactive group, a hydrosilylation reactive group, a monovalent hydrocarbon group, and an alkoxy group. Note that while component A) may contain hydroxyl groups bonded to a very small amount of silicon atoms, or hydrogen atoms bonded to silicon atoms, the effects are negligible. Therefore, the content of aryl groups necessary to achieve the technical effects of the present invention can be specified by taking into consideration only the proportion (content) of aryl groups of the silicon-bonded organic groups in component A).

In the abovementioned composition, component A is preferably one or more types of organopolysiloxanes selected from the group consisting of the following components A1 and A2:

A1) a straight chain or branched chain organopolysiloxane having, in the molecule, at least two radical reactive groups and/or a reactive group capable of crosslinking via a hydrosilylation reaction, wherein at least 10 mol % of the organic groups bonded to silicon atoms in the molecule are aryl groups;

A2) a straight chain or branched chain organopolysiloxane structure block, comprising: i) a resin structure block having $R^1SiO_{3/2}$ units (wherein, $R^1$ represents a group selected from the group consisting of a monovalent organic group, a hydroxyl group, and an alkoxy group having 1 to 6 carbon atoms); and optionally, in some cases, further having $SiO_{4/2}$ units; and ii) a straight chain diorganopolysiloxane structure part represented by $(R^2_2SiO_{2/2})_n$ (wherein, $R^2$ independently represents an alkyl group having 1 to 20 carbon atoms or a substituted or unsubstituted aryl group having 6 to 14 carbon atoms, optionally substituted with a halogen atom, wherein n represents a number within a range of 3 to 1000), wherein at least a portion of $R^1$ and $R^2$ are reactive groups capable of crosslinking via a radical reaction and/or a hydrosilylation reaction, and the proportion of aryl groups having 6 to 14 carbon atoms in the total number of moles of $R^1$ and $R^2$ groups (excluding hydroxyl groups) is 10 mol % or more.

Further, in the abovementioned composition, at least a portion, that is, a portion or all of component A is component A2, and the coupling part of the resin structure block of component A2 and the straight chain or branched chain organopolysiloxane structure block is an —Si—O—Si-bond, an —Si—$R^A$—Si— group (wherein, $R^a$ represents a straight chain or branched chain alkylene group having 2 to 14 carbon atoms), or combinations thereof.

In the abovementioned composition, the inorganic filler B is preferably one or more types selected from the group consisting of spherical silica particles, spherical alumina particles, and fluorescent fillers.

Further preferably, the spherical silica particles are spherical fused silica particles, while the spherical alumina particles are spherical fused alumina particles.

In a preferred aspect of the composition, component C is represented by the following general formula:

$$(R^aR^b_2SiO)_p\text{—K—}(SiR^b_2\text{—Y—}Si(R^b)_q(OR^c)_{3-q})_r$$

(wherein, $R^a$ represents a reactive group which may bond to a reactive group of component A; $R^b$ independently represents a group selected from the group consisting of a monovalent hydrocarbon group, a halogenated hydrocarbon group, and a cyanoalkyl group; $R^c$ independently represents a group selected from the group consisting of a group selected from the group consisting of a hydrogen atom, an alkyl group having 1 to 10 carbon atoms, and an alkoxyalkyl group having a total of 2 to 10 carbon atoms; K represents a straight chain or branched chain organopolysiloxane chain or silicone resin structure block represented by the average composition formula: $(R^b_3SiO_{1/2})_s(R^b_2SiO_{2/2})_t(R^bSiO_{3/2})_u(SiO_{4/2})_v(OR^c)_w$, (wherein, $R^b$ and $R^c$ are as defined above, s, t, u, v, and w each represent the number of each unit, and each represent a number of 0 to 500, with the proviso that not all of t, u, and v are 0; however, the value of s+w is u+2v or less); and Y is an oxygen atom, a divalent hydrocarbon group, or an group represented by the general formula:

[Formula 1]

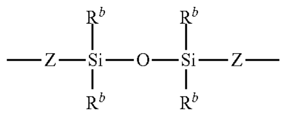

(wherein, $R^b$ is as defined above and Z is a divalent hydrocarbon group); within a possible range depending on the structure of K, p represents a number of 1 to 10, r represents a number of 1 to 10, and q represents a number of 0 to 2.)

More preferably, component C has the following structural formula:

[Formula 2]

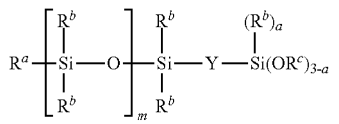

{wherein, $R^a$ represents a reactive group which may bond to a reactive group of component A; $R^b$ represents a group selected from the group consisting of a monovalent hydrocarbon group, a halogenated hydrocarbon group, and a cyanoalkyl group; $R^c$ represents a group selected from the group consisting of a hydrogen atom, an alkyl group having 1 to 10 carbon atoms, and an alkoxyalkyl group having a total of 2 to 10 carbon atoms; m is a number within a range of 0 to 500; a is 0, 1, or 2; and Y is an oxygen atom, a divalent hydrocarbon group, or an group represented by the general formula:

[Formula 3]

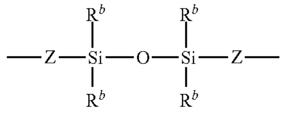

(wherein, $R^b$ is as defined above and Z is a divalent hydrocarbon group.)}

The present invention further provides a cured product obtained by any of the abovementioned curable organopolysiloxane compositions.

The light transmittance of the cured product according to the present invention preferably is 40% or more.

The cured product according to the present invention preferably has light diffusion properties such that upon determination thereof using a white light source (a white LED by a combination of a blue LED and a yellow phosphor); in a bidirectional transmittance distribution function, when the linear transmitted light intensity is 1, the transmitted light intensity at a light receiving position inclined by 45 degrees with respect to the axis of the linear transmitted light with a determination sample at its center is 0.65 or more.

Moreover, in the cured product according to the present invention, compared to a cured product obtained by a curable organopolysiloxane composition having the same components except for the abovementioned component (C), the breaking elongation of the cured product preferably increases by 10% or more.

The present invention also provides an optical member formed from the abovementioned cured product of the curable organopolysiloxane composition.

The abovementioned optical member is preferably a light diffusion film for a light receiving sensor.

Moreover, the abovementioned optical member is preferably a sealing agent for a light emitting diode or organic electroluminescence element.

The present invention also provides an optical apparatus comprising the abovementioned optical member.

Further, the present invention provides a coating agent containing: the abovementioned curable organopolysiloxane composition; and an organic solvent. This coating agent can be used to form a light diffusing layer on a substrate.

Effects of the Invention

The curable organopolysiloxane composition according to the present invention has excellent balance between light transmittance, light diffusion properties, and mechanical properties, in addition to having improved breaking elongation compared to conventional cured products, such that the cured product thereof is tough. When the cured product is particularly used as a thick optical member, cracking, etc. is unlikely to occur, with the durability capable of being further improved while maintaining mechanical strength and hardness. Moreover, the cured product obtained by the curable organopolysiloxane composition according to the present invention can independently handle a film or sheet made from a cured product, such that the curable composition according to the present invention can be used not only as a light diffusion coating agent on a substrate, but the cured product obtained thereby can also be used as a light diffusion film or light diffusion sheet.

BRIEF DESCRIPTION OF THE DRAWINGS

FIG. 1 is an SEM photo indicating the fracture surface of the sample of Example 2.

FIG. 2 is an SEM photo indicating the fracture surface of the sample of Comparative Example 4.

MODE FOR CARRYING OUT THE INVENTION

The present invention will be described below in more detail.

The curable organopolysiloxane composition according to the present invention contains the abovementioned component A, component B, and component C as essential components. Each of components A, B, and C is described below. Note that, unless otherwise indicated, when referring to the number of groups per molecule herein, the average number per molecule is referred to.

<Component (A)>

Component A has at least two radical reactive groups and/or hydrosilylation reactive groups in the molecule, wherein 10 mol % or more of organic groups bonded to silicon atoms in the molecule (silicon atom-bonded organic group) may be an aryl group, particularly preferably one type of organopolysiloxane which is a phenyl group, or a combination of two or more types of organopolysiloxane. Exemplary organopolysiloxanes which can be used as component A include the following.

(Aa) an organopolysiloxane having two or more radical reactive groups of one type or two more or types in the molecule;

(Ab) an organopolysiloxane having two or more groups having one or two or more types of hydrosilylation reactive carbon-carbon double bonds in the molecule; and (Ac) an organopolysiloxane having two or more hydrosilylation reactive silicon atom-bonded hydrogen atoms (SiH) in the molecule.

Furthermore, Aa-Ac may optionally further include a condensation reactive group in addition to the abovementioned reactive group. Here, the "condensation reactive group" refers to a group capable of forming Si—O—Si bonds via a condensation reaction, optionally a hydrolysis and condensation reaction.

One or two or more types of these Aa-Ac can be used in combination such that the organopolysiloxanes crosslink by a radical reaction to generate a cured product, the organopolysiloxanes crosslink by a hydrosilylation reaction to generate a cured product, or the organopolysiloxanes crosslink by combining a radical reaction and a hydrosilylation reaction to generate a cured product.

For example, in order to obtain a composition which is cured by a radical reaction, one or more types of Aa are preferably used as component A. Moreover, in order to obtain a composition which is cured by a hydrosilylation reaction, Ab and Ac are preferably used in combination as component A. In order to obtain a composition which combines and cures a radical reaction and a hydrosilylation reaction, a combination containing one or more types of Aa, Ab, and Ac as component A can be used, or a combination of one or more types of Abs and Ac can be used when the carbon-carbon double bonds contained in component Ab are radical reactive.

Exemplary organopolysiloxanes having different types of each other in each of the abovementioned components Aa to Ac are, for example, the same organopolysiloxanes having the same reactive group; however, when the bonding positions of the reactive groups with respect to the organopolysiloxane backbone and/or the content of the reactive groups are different, the organopolysiloxane backbones themselves may differ from one another.

[Component Aa]

Component Aa is an organopolysiloxane having two or more radical reactive groups of one type or two more or types in the molecule. The radical reactive groups contained in component Aa are functional groups which can crosslink with each other by a free radical mechanism in the presence of a thermal or photoradical initiator and/or in the presence of a high energy beam such as ultraviolet light and an electron beam, if desired in the presence of a crosslinking agent. Exemplary radical reactive groups include groups including carbon-carbon secondary bonds, with specific examples thereof including unsaturated carboxylate groups such as alkenyl groups, acrylates, and methacrylate groups. One type of the radical reactive group contained in component Aa may be used, or a combination of two or more types thereof may be used. When a combination of two or more radical reactive groups is used, two or more types of other organopolysiloxanes each having a different radical reactive group can be used in combination, even if one molecule has two or more radical reactive groups.

Component Aa may optionally have a condensation reactive group in addition to the radical reactive group. While the condensation reactive group is not particularly limited as long as it is a group capable of forming Si—O—Si bonds via a condensation reaction, examples thereof include condensation reactive groups selected from hydroxyl groups and alkoxy groups.

Preferably, component Aa may be an organopolysiloxane represented by the following average composition formula:

$$R^{11}_{a1}R^{12}_{b1}SiO_{(4-a1-b1)/2} \quad (1)$$

or a mixture of two or more thereof.

In the formula, $R^{11}$ is a radical reactive group, preferably a radical reactive group comprising a carbon-carbon double bond.

$R^{12}$ is a group selected from substituted or unsubstituted monovalent hydrocarbon groups, hydroxyl groups, and alkoxy groups, all of which do not have a radical reactive carbon-carbon double bond, provided that at least a portion of $R^{12}$ is a substituted or unsubstituted aryl group and the proportion of the aryl group is 10 mol % or more, preferably 20 mol % or more of the total number of moles of $R^{11}$ and $R^{12}$ (excluding hydroxyl groups). Alkoxy groups are preferably alkoxy groups having 1 to 6 carbon atoms. a1 and b1 are numbers satisfying the following conditions: $1 \leq a1+b1 \leq 3$ and $0.001 \leq a1/(a1+b1) \leq 0.33$. Furthermore, a1 and b1 are preferably numbers satisfying the following conditions: $1.5 \leq a1+b1 \leq 2.5$ and $0.005 \leq a1/(a1+b1) \leq 0.2$. This is because, by setting the amount of a1+b1 to be the lower limit or more of the abovementioned range, the flexibility of the obtained cured product can be increased, while, by setting a1+b1 to be the upper limit or less of the abovementioned range, the mechanical strength of the obtained cured product can be increased. Moreover, this is because, by setting a1/(a1+b1) to be the lower limit or more of the abovementioned range, the mechanical strength of the cured product can be increased, while, by setting a1/(a1+b1) to be the upper limit or less of the abovementioned range, the flexibility of the obtained cured product can be increased.

In the abovementioned average composition formula (1), radical reactive groups represented by $R^{11}$ include a group selected from: alkenyl groups having 2 to 20 carbon atoms, such as vinyl groups, allyl groups, butenyl groups, pentenyl groups, hexenyl groups, heptenyl groups, octenyl groups, nonenyl groups, decenyl groups, undecenyl groups, and dodecenyl groups; acryl-containing groups such as 3-acryloxypropyl groups and 4-acryloxibutyl groups; and methacryl-containing groups such as 3-methacryloxypropyl groups and 4-methacryloxibutyl groups. Exemplary monovalent hydrocarbon groups other than radical reactive groups having no carbon-carbon double bond represented by $R^{12}$ in the abovementioned average composition formula include groups selected from the group consisting of: alkyl groups such as methyl groups, ethyl groups, propyl groups, butyl groups, pentyl groups, hexyl groups, heptyl groups, octyl groups, nonyl groups, decyl groups, undecyl groups, and dodecyl groups; aryl groups such as phenyl groups, tolyl groups, xylyl groups, naphthyl groups, anthracenyl groups, phenanthryl groups, pyrenyl groups, and the like; and aralkyl groups such as benzyl groups, phenethyl groups, naphthyl ethyl groups, naphthyl propyl groups, anthracenyl ethyl groups, phenanthryl ethyl groups, pyrenyl ethyl groups, and the like. A portion of the hydrogen atoms of these alkyl groups may be substituted with a halogen atom or a hydroxyl group. Moreover, the aryl and aralkyl groups may be groups in which one or more of the hydrogen atoms thereof are substituted with alkyl groups such as methyl groups and ethyl groups, alkoxy groups such as methoxy groups and ethoxy groups, and/or halogen atoms such as chlorine atoms and bromine atoms.

The radical reactive group $R^{11}$ contained in component Aa is preferably a group selected from vinyl groups, allyl groups, hexenyl groups, acryl-containing groups, and methacryl-containing groups. The monovalent hydrocarbon group contained in component Aa is particularly preferably a group selected from a methyl group and a phenyl group (which is an aryl group).

The abovementioned component Aa can be an organopolysiloxane having a cyclic molecular structure consisting only of D units, or a straight chain molecular structure consisting of D units alone or consisting of D units and M units. Alternatively, component Aa may be an organopolysiloxane having a branched chain molecular structure or a resinous (network) molecular structure; wherein, while not limited thereto, exemplary branched chain or resinous organopolysiloxanes include organopolysiloxanes of the MQ type, MT type, MQT type, QT type, MDQ type, MDT type, and MDQT type. Here, M is a unit represented by the general formula $RSiO_{1/2}$, D is a unit represented by the general formula $R_2SiO_{2/2}$, T is a unit represented by the general formula $RSiO_{3/2}$, and Q is a unit represented by the $SiO_{4/2}$ (R is generally an organic group), wherein the terms M, D, T, and Q units are terms well known in the silicone art.

The organopolysiloxane represented by the above average composition formula is a radical reactive organopolysiloxane having a radical reactive group. However, when the organopolysiloxane has a hydroxyl group and/or an alkoxy group as $R^{12}$ of the average composition formula, the organopolysiloxane can be condensation reactive in addition to being radical reactive.

In one particularly preferred aspect, component Aa comprises:

(Aa-1) a straight chain or branched chain organopolysiloxane having a radical reactive group only at the end of a molecular chain; and optionally, in some cases, (Aa-2) a radical reactive group-containing organopolysiloxane resin having at least one branched siloxane unit in a molecule with an amount of radical reactive groups within a range of 0.01 to 7.0 mass %.

Component (Aa-1) is a straight chain organopolysiloxane having, at a molecular terminal, siloxane units represented by $$(Rad)R^{21}_2SiO_{1/2}$$

(wherein, Rad represents a radical reactive group and corresponds to $R^{11}$ of the abovementioned average composition formula (1), and $R^{21}$ corresponds to $R^{12}$ of the abovementioned average composition formula (1)), while the other siloxane units consist substantially only of siloxane units represented by $R^{22}{}_2SiO_{2/2}$, or component (Aa-1) is a branched chain organopolysiloxane further comprising one or more T units and/or Q units. $R^{22}$ has the same meaning as $R^{12}$ of the average composition formula (1) described above. Furthermore, the degree of siloxane polymerization of component (Aa-1) is within a range of 7 to 1002 including terminal siloxane units. Such a component (Aa-1) is particularly preferably a straight chain organopolysiloxane in which both ends of the molecular chain are blocked with a siloxane unit represented by $(Rad)R^{21}{}_2SiO_{1/2}$.

Component (Aa-2) is a radical reactive group-containing organopolysiloxane resin, for example, represented by the average unit formula:

$$(R^{31}SiO_{3/2})_{o1}(R^{31}{}_2SiO_{2/2})_{p1}(R^{31}{}_3SiO_{1/2})_{q1}(SiO_{4/2})_{r1}(XO_{1/2})_{s1} \quad (2).$$

In the average unit formula (2) above, $R^{31}$ independently represents a group selected from the group consisting of a radical reactive group represented by $R^{11}$ in the average composition formula (1) of the abovementioned component Aa and a substituted or unsubstituted monovalent hydrocarbon group having no radical reactive carbon-carbon double bonds represented by $R^{12}$, a hydroxyl group, and an alkoxy group. Alkoxy groups are preferably alkoxy groups having 1 to 6 carbon atoms. Furthermore, X represents a hydrogen atom or an alkyl group having 1 to 3 carbon atoms. However, among all $R^{31}$, $R^{31}$ is a radical reactive group at least within a range in which the amount of radical reactive groups in the organopolysiloxane resin satisfies a range of 0.01 to 7.00 mass %, preferably a range of 0.05 to 6.00 mass %, and at least a portion of $R^{31}$ in the siloxane unit expressed by $R^{31}{}_3SiO_{1/2}$ are particularly preferably radical reactive groups.

Further, in the abovementioned Formula (2), (o1+r1) is a positive number, p1 is 0 or a positive number, q1 is 0 or a positive number, s1 is 0 or a positive number, and p1/(o1+r1) is a number within a range of 0 to 10; q1/(o1+r1) is a number within a range of 0 to 5, and (o1+r1)/(o1+p1+q1+r1) is a number within a range of 0.3 to 0.9, and s1/(o1+p1+q1+r1) is a number within a range of 0 to 0.4.

As component (Aa-2), the radical reactive group-containing MQ organopolysiloxane resin represented by the average unit formula is exemplified:

$$((Rad)R^{31}{}_2SiO_{1/2})_{q11}(R^{31}{}_3SiO_{1/2})_{q21}(SiO_{4/2})_{r11} \quad (3)$$

(wherein, Rad represents a radical reactive group and has the same meaning as $R^{11}$ of the abovementioned average composition formula (1), $R^{31}$ has the same meaning as $R^{12}$ of the abovementioned average composition formula (1), q11+q21+r1 is a number within a range of 50 to 500, (q11+q21)/r11 is a number within a range of 0.1 to 2.0, and q11 is the number within the range in which the content of the radical reactive groups in the organopolysiloxane resin satisfies a range of 0.01 to 7.00 mass %, preferably 0.05 to 6.00 mass %.)

Using both component (Aa-1) (having a radical reactive group only at one end of the molecular chain) and component (Aa-2) (which is an organopolysiloxane resin having a certain number of radical reactive groups) can provide a cured product with excellent quick curability/quick dryness as an overall composition and with excellent mechanical strength and flexibility.

[Component Ab]

Component Ab is an organopolysiloxane having two or more groups with one or two or more hydrosilylation reactive carbon-carbon double bonds in the molecule, wherein 10 mol % or more of the silicon atom-bonded organic groups in the molecule are aryl groups, preferably phenyl groups. The hydrosilylation reactive group contained in component Ab may be a group capable of reacting with an SiH group to form a C—Si bond and is not limited to a specific group; however, as described below, examples thereof include monovalent hydrocarbon groups including carbon-carbon double bonds, with specific examples thereof including alkenyl groups, particularly alkenyl groups having a carbon-carbon double bond at a terminal. One type of the hydrosilylation reactive group contained in component Ab may be used, or a combination of two or more types may be used. When a combination of two or more hydrosilylation reactive groups is used, two or more types of other organopolysiloxanes each having a different hydrosilylation reactive group can be used in combination, even if one molecule has two or more hydrosilylation reactive groups.

Component Ab may optionally have a condensation reactive group in addition to the hydrosilylation reactive group. While the condensation reactive group is not particularly limited as long as it is a group capable of forming Si—O—Si bonds via a condensation reaction, examples thereof include condensation reactive groups selected from hydroxyl groups and alkoxy groups. Alkoxy groups are preferably alkoxy groups having 1 to 6 carbon atoms.

Preferably, component Ab may be an organopolysiloxane represented by the following average composition formula:

$$R^{41}{}_{a4}R^{42}{}_{b4}SiO_{(4-a4-b4)/2} \quad (4)$$

or a mixture of two or more thereof.

In the formula, $R^{41}$ is a monovalent hydrocarbon group having a hydrosilylation reactive group, preferably a carbon-carbon double bond, and is preferably an alkenyl group.

R42 is a group selected from substituted or unsubstituted monovalent hydrocarbon groups (other than hydrosilylation reactive groups), hydroxyl groups, and alkoxy groups, provided that at least a portion of $R^{42}$ is a substituted or unsubstituted aryl group, wherein the proportion of the aryl group is 10 mol % or more of the total number of moles of $R^{41}$ and $R^{42}$ (excluding hydroxyl groups).

a4 and b4 are numbers satisfying the following conditions: $1 \le a4+b4 \le 3$ and $0.001 \le a4/(a4+b4) \le 0.33$. Further, a4 and b4 are preferably numbers satisfying the following conditions: $1.5 \le a4+b4 \le 2.5$ and $0.005 \le a4/(a4+b4) \le 0.2$. This is because, by setting the amount of a4+b4 to be the lower limit or more of the abovementioned range, the flexibility of the obtained cured product can be increased, while, by setting a4+b4 to be the upper limit or less of the abovementioned range, the mechanical strength of the obtained cured product can be increased. Moreover, this is because, by setting a4/(a4+b4) to be the lower limit or more of the abovementioned range, the mechanical strength of the cured product can be increased, while, by setting a4/(a4+b4) to be the upper limit or less of the abovementioned range, the flexibility of the obtained cured product can be increased.

Exemplary hydrosilylation reactive groups represented by $R^{41}$ in the abovementioned average composition Formula (4) include an alkenyl group having 2 to 20 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups. $R^{41}$ is particularly preferably independently a group selected from a vinyl group, an allyl group, and a hexenyl group, particularly preferably a vinyl group. Exemplary monovalent hydrocarbon groups other than hydrosilylation reactive groups represented by $R^{42}$ in the abovementioned average composition formula include groups selected from the group consisting of: alkyl groups such as methyl groups, ethyl groups, propyl groups, butyl groups, pentyl groups, hexyl groups, heptyl groups, octyl groups, nonyl groups, decyl groups, undecyl groups, and dodecyl groups; aryl groups such as phenyl groups, tolyl groups, xylyl groups, naphthyl groups, anthracenyl groups, phenanthryl groups, pyrenyl groups, and the like; and aralkyl groups such as benzyl groups, phenethyl groups, naphthyl ethyl groups, naphthyl propyl groups, anthracenyl ethyl groups, phenanthryl ethyl groups, pyrenyl ethyl groups, and the like. A portion of the hydrogen atoms of these alkyl groups may be substituted with a halogen atom or a hydroxyl group. Moreover, the aryl and aralkyl groups may be groups in which one or more of the hydrogen atoms thereof are substituted with alkyl groups such as methyl groups and ethyl groups, alkoxy groups such as methoxy groups and ethoxy groups, and/or halogen atoms such as chlorine atoms and bromine atoms.

The hydrosilylation reactive group $R^{41}$ contained in component Ab is preferably a group selected from a vinyl group, an allyl group, and a hexenyl group, particularly a vinyl group. The monovalent hydrocarbon group other than the hydrosilylation reactive group contained in component Ab is particularly preferably a group selected from a methyl group and a phenyl group as an aryl group.

The abovementioned component Ab can be an organopolysiloxane having a cyclic molecular structure consisting only of D units, or a straight chain molecular structure consisting of D units alone or consisting of D units and M units. Alternatively, component Ab may be an organopolysiloxane having a branched chain molecular structure or a resinous (network) molecular structure; wherein, while not limited thereto, exemplary branched chain or resinous organopolysiloxanes include organopolysiloxanes of the MQ type, MT type, MQT type, QT type, MDQ type, MDT type, and MDQT type.

The organopolysiloxane represented by the above average composition formula (4) is a hydrosilylation reactive organopolysiloxane having a hydrosilylation reactive group. However, when the organopolysiloxane has a hydroxyl group and/or an alkoxy group as $R^{42}$ of the average composition formula, the organopolysiloxane can be condensation reactive in addition to being hydrosilylation reactive. Alkoxy groups are preferably alkoxy groups having 1 to 6 carbon atoms.

In one particularly preferred aspect, component Ab comprises:

(Ab-1) a straight chain or branched chain organopolysiloxane having an alkenyl group only at the end of a molecular chain; and optionally, in some cases, (Ab-2) an organopolysiloxane resin containing an alkenyl group having at least one branched siloxane unit in a molecule with an amount of vinyl ($CH_2{=}CH{-}$) groups within a range of 0.01 to 7.00 mass %.

Component (Ab-1) is a straight chain or branched chain organopolysiloxane having a siloxane unit represented by $$(Alk)R^{42}{}_2SiO_{1/2}$$

(wherein, Alk is an alkenyl group having two or more carbon atoms and corresponds to $R^{41}$ of the abovementioned average composition formula (4), and $R^{42}$ corresponds to $R^{42}$ of the abovementioned average composition formula (4)), while the other siloxane units consist substantially only of siloxane units represented by $R^{42}{}_2SiO_{2/2}$; or component (Ab-1) is a branched chain organopolysiloxane further comprising one or more T and/or Q units. Furthermore, the degree of siloxane polymerization of component (Ab-1) is within a range of 7 to 1002 including terminal siloxane units. Such a component (Ab-1) is particularly preferably a straight chain organopolysiloxane in which both ends of the molecular chain are blocked with a siloxane unit represented by $(Alk)R^{42}{}_2SiO_{1/2}$.

Component (Ab-2) is an alkenyl group-containing organopolysiloxane resin, for example, represented by the average unit formula:

$$(R^{51}SiO_{3/2})_{o2}(R^{51}{}_2SiO_{2/2})_{p2}(R^{51}{}_3SiO_{1/2})_{q2}(SiO_{4/2})_{r2}(XO_{1/2})_{s2} \quad (5)$$

The alkenyl group-containing organopolysiloxane resin represented above is exemplified. In the average unit formula (5) above, $R^{51}$ is independently a group which is defined as a group represented by $R^{41}$ and $R^{42}$ of the average composition formula (4) of the abovementioned component Ab and is selected from an alkenyl group (which is a hydrosilylation reactive group), a monovalent hydrocarbon group (other than a hydrosilylation reactive group), a hydroxyl group, and an alkoxy group, wherein X is a hydrogen atom or an alkyl group having one to three carbon atoms. Alkoxy groups are preferably alkoxy groups having 1 to 6 carbon atoms. However, among all $R^{51}$, $R^{51}$ is an alkenyl group at least within a range in which the amount of vinyl ($CH_2{=}CH{-}$) groups in the organopolysiloxane resin satisfies a range of 0.01 to 7.00 mass %, preferably a range of 0.05 to 6.00 mass %, and at least a portion of $R^{51}$ in the siloxane unit expressed by $R^{51}{}_3SiO_{1/2}$ are particularly preferably alkenyl groups.

In Formula (5), in the abovementioned Formula (5), (o2+r2) is a positive number, p2 is 0 or a positive number, q2 is 0 or a positive number, s2 is 0 or a positive number, and p2/(o2+r2) is a number within a range of 0 to 10, while q2/(o2+r2) is a number within a range of 0 to 5, and (o2+r2)/(o2+p2+q2+r2) is a number within a range of 0.3 to 0.9, and s2/(o2+p2+q2+r2) is a number within a range of 0 to 0.4.

As component (Ab-2), the alkenyl group-containing MQ organopolysiloxane resin represented the average unit formula is exemplified:

$$((Alk)R^{51}{}_2SiO_{1/2})_{q21}(R^{51}{}_3SiO_{1/2})_{q22}(SiO_{4/2})_{r2} \quad (6)$$

(wherein, Alk is an alkenyl group having two or more carbon atoms, $R^{51}$ is a group other than the hydrosilylation reactive group defined in the abovementioned average formula (5), while q21+q22+r2 is a number within a range of 50 to 500, (q21+q22)/r2 is a number within a range of 0.1 to 2.0, and q21 is the number within a range in which the content of vinyl ($CH_2{=}CH{-}$) groups in the organopolysiloxane resin satisfies a range of 0.01 to 7.00 mass %, preferably a range of 0.05 to 6.00 mass %.)

Using both component (Ab-1) (having an alkenyl group only at one end of the molecular chain) and component (Ab-2) (which is an organopolysiloxane resin having a certain number of alkenyl groups) can provide a curing reaction product with excellent quick curability/quick dryness as an overall composition and with excellent mechanical strength and flexibility.

[Preferred Form of Component(s) Aa and/or Ab]

Component Aa and/or Ab in this case are:

i) a straight chain or branched chain organopolysiloxane structure block, comprising: i) a resin structure block having $R^{61}SiO_{3/2}$ units (wherein, $R^{61}$ represents a group selected from the group consisting of a radical reactive group, a hydrosilylation reactive group, and a monovalent organic group other than the radical reactive group and the hydrosilylation reactive group, a hydroxyl group, and an alkoxy group having 1 to 6 carbon atoms); and optionally, in some cases, further having $SiO_{4/2}$ units; and ii) an organopolysiloxane which includes a straight chain or branched chain organopolysiloxane structure block consisting of a straight chain diorganopolysiloxane structure part represented by $(R^{62}{}_2SiO_{2/2})_n$ (wherein, $R^{62}$ independently represents a group which is selected from a radical reactive group, a hydrosilylation reactive group, an alkyl group (having 1 to 20 carbon atoms which may be substituted with a halogen atom), and a substituted or unsubstituted aryl group (having 6 to 14 carbon atoms); n represents a number within a range of 3 to 1000, preferably 20 to 300), wherein at least a portion of $R^{61}$ and $R^{62}$ is a radical reactive group and/or hydrosilylation reactive group, and wherein the proportion of aryl groups having 6 to 14 carbon atoms in the total number of moles of $R^{61}$ and $R^{62}$ groups (excluding hydroxyl groups and hydrogen atoms) is 10 mol % or more, preferably 20 mol % or more, and more preferably within a range of 20 to 70 mol %. A structure having such a resin structure block and a straight chain or branched chain block (linear structure block) including a straight chain structure part is herein referred to as a resin linear structure.

The radical reactive groups which may be represented by $R^{61}$ and $R^{62}$ include groups independently selected from those represented by $R^{11}$ of the average composition formula (1) in the description of component Aa described above. The radical reactive groups represented by $R^{61}$ and $R^{62}$ are preferably groups selected from vinyl groups, allyl groups, hexenyl groups, acryl-containing groups, and methacryl-containing groups, and particularly preferably vinyl groups, allyl groups, and hexenyl groups. The hydrosilylation reactive groups which may be represented by $R^{61}$ and $R^{62}$ include groups independently selected from those represented by $R^{41}$ of the average composition formula (4) of component Ab described above. The hydrosilylation reactive groups represented by $R^{61}$ and $R^{62}$ are preferably groups selected from vinyl groups, allyl groups, and hexenyl groups, and particularly preferably vinyl groups.

The monovalent organic groups other than the radical reactive group and the hydrosilylation reactive group represented by $R^{61}$ may be substituted or unsubstituted monovalent hydrocarbon groups which have poor radical reaction and hydrosilylation reactivity and have no carbon-carbon double bonds. Exemplary substituted or unsubstituted monovalent hydrocarbon groups include the following groups selected from the group consisting of: alkyl groups such as methyl groups, ethyl groups, propyl groups, butyl groups, pentyl groups, hexyl groups, heptyl groups, octyl groups, nonyl groups, decyl groups, undecyl groups, and dodecyl groups; aryl groups such as phenyl groups, tolyl groups, xylyl groups, naphthyl groups, anthracenyl groups, phenanthryl groups, pyrenyl groups, and the like; and aralkyl groups such as benzyl groups, phenethyl groups, naphthyl ethyl groups, naphthyl propyl groups, anthracenyl ethyl groups, phenanthryl ethyl groups, pyrenyl ethyl groups, and the like. A portion of the hydrogen atoms of these alkyl groups may be substituted with a halogen atom or a hydroxyl group. Moreover, the aryl and aralkyl groups may be groups in which one or more of the hydrogen atoms thereof are substituted with alkyl groups such as methyl groups and ethyl groups, alkoxy groups such as methoxy groups and ethoxy groups, and/or halogen atoms such as fluorine atoms, chlorine atoms, and bromine atoms.

Exemplary alkoxy group having 1 to 6 carbon atoms which may be represented by $R^{61}$ include straight chain, branched chain, and cyclic alkoxy groups such as methoxy, ethoxy, n-propoxy, isopropoxy, butoxy, pentyloxy, hexyloxy, and cyclohexyloxy. Alkoxy groups are particularly preferably a methoxy group.

Exemplary alkyl groups having 1 to 20 carbon atoms which may be represented by $R^{62}$ and substituted with halogen atoms include unsubstituted alkyl groups such as methyl groups, ethyl groups, propyl groups, butyl groups, pentyl groups, hexyl groups, heptyl groups, octyl groups, nonyl groups, decyl groups, undecyl groups, and dodecyl groups, and alkyl groups in which one or more of the hydrogen atoms of these alkyl groups are substituted with halogen atoms, for example, fluorine, chlorine, or bromine atoms. Alkyl group are particularly preferably methyl groups.

Exemplary groups selected from substituted or unsubstituted aryl groups having 6 to 14 carbon atoms which may be represented by $R^{62}$ include: phenyl groups, tolyl groups, xylyl groups, naphthyl groups, anthracenyl groups, phenanthryl groups, and pyrenyl groups; and groups in which some or all of the hydrogen atoms bonded to these groups are substituted with halogen atoms such as fluorine atoms, chlorine atoms, or bromine atoms. Aryl groups are particularly preferably phenyl groups.

The straight chain or branched chain organopolysiloxane structure block containing the straight chain diorganopolysiloxane structural part of ii) above consists of only the straight chain diorganopolysiloxane represented by $(R^{62}{}_2SiO_{2/2})_n$; alternatively, the straight chain diorganopolysiloxane can have a branched chain organopolysiloxane structure formed by bonding to T units and/or Q units, preferably T units.

This component can be a structure formed by bonding the organopolysiloxane resin structure block of i) above and the straight chain or branched chain organopolysiloxane block of ii), while the coupling part of the resin structure block and the straight chain or branched chain organopolysiloxane structure block is preferably selected from —Si—O—Si— bonds, —Si—$R^A$—Si— (wherein, $R^A$ represents a straight chain or branched chain alkylene group having 2 to 14, preferably 2 to 10 carbon atoms), and combinations thereof. The formation method of the —Si—O—Si— bonds between structural blocks of i) and ii) is not particularly limited; however, for example, between the resin structure block of i) and the straight chain or branched chain block ii), each Si—OH and/or Si—OR groups (OR is a hydrolyzable group such as alkoxy having 1 to 6 carbon atoms) can be formed by crosslinking via a condensation reaction. Consequently, in this case, for example, as a method for synthesizing a resin linear structure, a method is exemplified in which a resin structure block of i) is formed earlier, and a straight chain or branched chain diorganopolysiloxane block is synthesized under conditions in which a straight chain or branched chain organopolysiloxane block is connected to the SiOH and/or SiOR group contained in the resin structure block. For example, in the presence of resin structure blocks having SiOH and/or SiOR groups, cyclic organopolysiloxanes can optionally be ring-opened and polymerized in the presence of additional crosslinkers to obtain the desired structure of the product. The synthesis reaction of such an organopolysiloxane itself can be carried out using known methods.

If the coupling part of a branched chain organopolysiloxane structure block comprising a resin structure block and a straight chain or straight chain part is an —Si—$R^A$—

Si— group (wherein, $R^a$ represents a straight chain or branched chain alkylene group having 2 to 14, preferably 2 to 10 carbon atoms) and, for example, resin structure blocks having hydrosilylation reactive alkenyl groups are subjected to a hydrosilylation reaction with a straight chain or branched chain diorganopolysiloxane block copolymer having silicon-bonded hydrogen atoms (SiH groups), an organopolysiloxane having a resin linear structure in which alkenyl groups having a resin structure block are $R^a$ parts is obtained. The synthesis of an organopolysiloxane having a resin linear structure can be carried out, for example, in accordance with the method described in JP 2010-1336 A.

However, the method for synthesizing an organopolysiloxane having a resin linear structure comprising the abovementioned structures of i) and ii) is not limited to the method exemplified above.

A particularly preferred aspect of the organopolysiloxane having a resin linear structure is described in more detail below.

The organopolysiloxane having a resin linear structure used in the present invention is particularly preferably an organopolysiloxane which includes: T units represented by $R^{Ar}SiO_{3/2}$ (wherein, $R^{Ar}$ represents an aryl group having 6 to 14 carbon atoms); a resin structure part having T units with radical reactive groups or hydrosilylation reactive groups; and an organosiloxane structure represented by $R^{71}{}_2SiO_{2/2})_n$ (wherein, $R^{71}$ is an alkyl group having 1 to 20 carbon atoms which may be substituted with halogen atoms or an aryl group having 6 to 14 carbon atoms which may be substituted with halogen atoms, and n is a number within a range of 3 to 1000).

Here, examples of aryl groups having from 6 to 14 carbon atoms include phenyl groups, tolyl groups, xylyl groups, naphthyl groups, and anthracenyl groups, with phenyl groups preferable from the perspective of industrial production. In addition, examples of $R^{71}$ include: alkyl groups such as methyl groups, ethyl groups, propyl groups, butyl groups, pentyl groups, hexyl groups, heptyl groups, octyl groups, nonyl groups, decyl groups, undecyl groups, and dodecyl group; aryl groups such as phenyl groups, tolyl groups, xylyl groups, naphthyl groups, and anthracenyl groups; and groups in which some or all of the hydrogen atoms bonded to these groups are substituted with halogen atoms such as fluorine atoms, chlorine atoms, or bromine atoms, with methyl groups or phenyl groups preferable from the perspective of industrial production. The radical reactive groups are groups selected from: alkenyl groups having 2 to 20 carbon atoms, such as vinyl groups, allyl groups, butenyl groups, pentenyl groups, hexenyl groups, heptenyl groups, octenyl groups, nonenyl groups, decenyl groups, undecenyl groups, and dodecenyl groups; acryl-containing groups such as 3-acryloxypropyl groups and 4-acryloxibutyl groups; and methacryl-containing groups such as 3-methacryloxypropyl groups and 4-methacryloxibutyl groups; wherein, particularly preferably, the hydrosilylation reactive groups are alkenyl groups having 2 to 20 carbon atoms, such as vinyl groups, allyl groups, butenyl groups, pentenyl groups, hexenyl groups, heptenyl groups, octenyl groups, nonenyl groups, decenyl groups, undecenyl groups, and dodecenyl groups, preferably groups selected from vinyl groups, allyl groups, and hexenyl groups, and particularly preferably vinyl groups.

More specifically, the organopolysiloxane component having a resin linear structure is an organopolysiloxane block copolymer of a resin linear structure which has, in addition to the abovementioned $R^{Ar}SiO_{3/2}$ units as $R^{72}SiO_{3/2}$, a structure in which a resin structure block (which has: T units: $R^{72}SiO_{3/2}$ (wherein, $R^{72}$ is a radical reactive group, a hydrosilylation reactive group, and a monovalent organic group other than the radical reactive group and the hydrosilylation reactive group, a hydroxyl group, or an alkoxy group having 1 to 6 carbon atoms, and wherein at least one or more of all $R^{72}$ in the molecule is an aryl group having 6 to 14 carbon atoms, and further at least one or more thereof is a radical reactive group or a hydrosilylation reactive group); and optionally, in some cases, siloxane units represented by Q units: $SiO_{4/2}$) is coupled to a linear structure block (represented by $(R^{71}{}_2SiO_{2/2})_n$ (wherein, $R^{71}$ and n are as defined above)) via a silalkylene bond (-alkylene-Si—O—Si—) or —Si—O—Si-bond.)) Particularly preferably, the resin structure block and the linear structure block in this organopolysiloxane block copolymer are connected by a silalkylene bond and the Si atoms contained in the resin structure are Si atoms forming $R^{Ar}SiO_{3/2}$ units or Si atoms of the T units having a radical reactive or hydrosilylation reactive group.

The organopolysiloxane having a resin/linear structure forms a partial structure formed from a resinous organopolysiloxane which contains, as essential units, arylsiloxane units represented by $R^{Ar}SiO_{3/2}$ T units and T units having radical reactive groups or hydrosilylation reactive groups, in addition to containing multiple forms of T units or T units and Q units bonded to one another. In particular, when an aryl group such as a phenyl group is contained in the molecule, the refractive index of the organopolysiloxane component can be increased compared to the case in which the silicon atom-bonded organic group is an alkyl group, for example, a methyl group alone. Suitably, the organopolysiloxane having a resin linear structure is preferably an organopolysiloxane containing 20 to 80 mass % of the total mass of the organopolysiloxane of arylsiloxane units represented by $R^{Ar}SiO_{3/2}$, wherein the resin structure is particularly preferably formed solely from arylsiloxane units represented by $R^{Ar}SiO_{3/2}$, except for siloxane units having a hydrosilylation reactive group or a radical reactive group as a monovalent organic group.

In contrast, the linear structure part is a non-reactive block represented by $R^{71}{}_2SiO_{2/2})_n$ and is a structure in which at least 3 and preferably at least 5 diorganosiloxy units represented by $R^{71}{}_2SiO_{2/2}$ are linked in a chain. This linear structure block is a partial structure which imparts moderate flexibility to the cured product obtained by the curable composition according to the present invention. In the formula, n is the degree of polymerization of the diorganosiloxy unit constituting the partial structure, which is preferably within a range of 3 to 250, more preferably within a range of 5 to 250, 50 to 250, 100 to 250, or 200 to 250. When n in the partial structure exceeds the above upper limit, the properties as a linear molecule derived from the linear structure are strongly expressed and the film-forming properties may be diminished in some cases. In contrast, when n is less than the lower limit described above, the nature of the linear molecule is insufficient. Particularly when thin films are formed, cissing, etc. readily occurs, and when the curable composition according to the present invention is used as a coating agent or when films are formed, defects such as not being uniformly applied to the substrate may occur.

The group $R^{71}$ on the diorganosiloxy unit constituting the linear structure part is preferably an alkyl group or an aryl group and these must be non-reactive with respect to the resin structure and the functional group thereof in the same molecule, in addition to having to maintain the linear structure without causing polymerization such as a condensation reaction in the molecule. The alkyl group and the aryl group can be selected from groups previously described in the definition of $R^{62}$, with $R^{71}$ preferably being a methyl group or a phenyl group from an industrial point of view.

The resin structure block and the linear structure block in the organopolysiloxane in the resin/linear structure are preferably linked by a silalkylene bond derived from a hydrosilylation reaction between an alkenyl group and a silicon atom-bonded hydrogen atom, or a Si—O—Si bond formed from a condensable reaction group at the end of the resin structure part or the linear structure part. In particular, in the resin/linear structure organopolysiloxane used in the present invention, it is particularly preferable for the Si atoms bonded to the resin structure to constitute an $R^{71}SiO_{3/2}$ unit, and particularly preferable to have the following partial structure (T-Dn). From an industrial perspective, in the following partial structure formula (T-Dn), $R^1$ (corresponding to $R^{72}$ above) is preferably a phenyl group, while R (corresponding to $R^{71}$) is preferably independently a methyl group or a phenyl group, particularly preferably a methyl group.

Partial Structure (T-Dn)

[Formula 4]

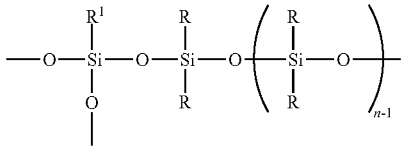

(T-Dn)

Preferably, in the above partial structure, the end of the left Si—O-bond constituting a T unit is bonded to a hydrogen atom or another siloxane unit constituting the resin structure, respectively, and is preferably bonded to another T unit. On the other hand, the end of the right Si—O-bond is bonded to another siloxane unit, triorganosiloxy unit (M unit), or a hydrogen atom that forms a linear structure or a resin structure. Needless to say, a silanol group (Si—OH) is formed when a hydrogen atom is bonded to the end of the Si—O—bond.

If a thin coating, for example a film, is formed from the curable composition according to the present invention, in terms of uniform coatability of a coating film on a substrate, the organopolysiloxane having a resin linear structure is preferably an organopolysiloxane containing only arylsiloxane units represented by $R^{Ar}SiO_{3/2}$ and diorganosiloxane units represented by $R^{71}{}_2SiO_{2/2}$, in addition to siloxane units having radical reactive or hydrosilylation reactive groups. Specifically, this organopolysiloxane is preferably an organopolysiloxane represented by the following unit compositional formula:

$$\{(R^{71}{}_2SiO_{2/2})\}_a\{R^{Ar}SiO_{3/2}\}_b\{R^{Re}SiO_{3/2}\}_{1\text{-}a\text{-}b}$$

wherein, $R^{71}$ and $R^{Ar}$ are as described above and $R^{Re}$ represents a radical reactive group and/or a hydrosilylation reactive group. Radical reactive groups and hydrosilylation reactive groups are each previously defined as groups represented by $R^{11}$ and $R^{41}$. a is a number within a range of 0.8 to 0.2 and more suitably a number within a range of 0.80 to 0.40. The number b is within a range of 0.2 to 0.6.

10 mol % or more, preferably 12 mol % or more, of the total groups bonded to all of the siloxane units in the organopolysiloxane having the abovementioned resin linear structure are aryl groups, preferably phenyl groups, wherein 10 to 70 mol %, suitably 12 to 70 mol %, of the silicon-bonded groups in the siloxane units can preferably be designed as aryl groups.

In component A, according to the present invention: the hardness of the cured product obtained by the curable organopolysiloxane composition according to the present invention can be designed to be relatively high due to the fact that 10 mol % or more, suitably 20 mol % or more, of the overall silicon-bonded organic groups are aryl groups, for example phenyl groups; the cured product can be used as a bulk material such as a film or sheet which is independent of itself; and, when component A is combined with components B and C, a cured product having a good balance between excellent optical diffusion properties and mechanical properties can be obtained. Note that the combination with component C, which will be described later, improves mechanical properties, toughness, and durability such as breaking elongation, without substantially impairing the hardness and mechanical strength of the cured product. In contrast, when the content of the aryl group is less than the lower limit described above, the hardness and mechanical strength of the cured product will be insufficient; and in particular, when it is used as a thick optical member, problems such as deformation may occur.

[Component Ac]

Component Ac is an organohydrogenpolysiloxane having two or more hydrosilylation reactive silicon-bonded hydrogen atoms (SiH) on average in the molecule. This component Ac is a component for obtaining a hydrosilylation reaction curable composition using an organopolysiloxane (component Ab) (having an average of two or more groups per molecule capable of undergoing a hydrosilylation reaction with an SiH group) in combination. Component Ac is a component which functions as a crosslinking agent for component Ab.

Specific examples of such component Ac include 1,1,3-3-tetramethyldisiloxane, 1,3,5,7-tetramethyl cyclotetrasiloxane, tris(dimethylhydrogensiloxy)methylsilane, tris(dimethylhydrogensiloxy)phenylsilane, methylhydrogenpolysiloxanes blocked at both ends of a molecular chain with a trimethylsiloxy group, dimethylsiloxane/methylhydrogensiloxane copolymers blocked at both ends of a molecular chain with a trimethylsiloxy group, dimethylpolysiloxane blocked at both ends of a molecular chain with a dimethylhydrogensiloxane group, dimethylsiloxane/methylhydrogensiloxane copolymers blocked at both ends of a molecular chain with a dimethylhydrogensiloxane group, methylhydrogensiloxane/diphenylsiloxane copolymers blocked at both ends of a molecular chain with a trimethylsiloxy group, methylhydrogensiloxane/diphenylsiloxane/dimethylsiloxane copolymers blocked at both ends of a molecular chain with a trimethylsiloxy group, hydrolytic condensates of a trimethylsilane, copolymers containing $(CH_3)_2HSiO_{1/2}$ units and $SiO_{4/2}$ units, copolymers containing $(CH_3)_2HSiO_{1/2}$ units, $SiO_{4/2}$ units, and $(C_6H_5)SiO_{3/2}$ units, and mixtures of two or more types thereof.

In the curable composition according to the present invention, particularly suitably, component Ac comprises:

(Ac-1) a straight chain or partially branched organohydrogenpolysiloxane having a silicon-bonded hydrogen atom on the end of a molecular chain; and optionally, in some cases, (Ac-2) a straight chain or resinous organohydrogenpolysiloxane having at least three silicon atom-bonded hydrogen atoms per molecule.

Component (Ac-1) is an organohydrogenpolysiloxane having a silicon atom-bonded hydrogen atom at only the end of a molecular chain, which is a component that functions as a chain length extender in a hydrosilylation reaction with the abovementioned component (Ab) and improves the flexibility of the cured reaction product. Such component (Ac-1) is suitably a straight chain organohydrogenpolysiloxane, with, for example, a component represented by the following structural formula capable of suitably being used.

$HMe_2SiO(Ph_2SiO)_{m1}SiMe_2H$ $HMe_2SiO(Me_2SiO)_{m1}SiMe_2H$ $HMePhSiO(Ph_2SiO)_{m1}SiMePhH$ $HMePhSiO(Me_2SiO)_{m1}SiMePhH$ $HMePhSiO(Ph_2SiO)_{m1}(MePhSiO)_{n1}SiMePhH$ $HMePhSiO(Ph_2SiO)_{m1}(Me_2SiO)_{n1}SiMePhH$

In the above formulae, Me and Ph represent a methyl group and a phenyl group, respectively, m1 represents an integer from 1 to 100, and n1 represents an integer from 1 to 50.

Component (Ac-2) is a straight chain or resinous organohydrogenpolysiloxane having at least three silicon atom-bonded hydrogen atoms per molecule and is a component which can impart rapid curability to the present composition when used in combination with the abovementioned (Ac-1), Exemplary straight chain organohydrogen polysiloxanes include: a methylhydrogenpolysiloxane blocked at both molecular chain terminals with trimethyl siloxy groups; a dimethylsiloxane/methylhydrogensiloxane copolymer blocked at both molecular chain terminals with trimethyl siloxy groups; a dimethylsiloxane/methylhydrogensiloxane copolymer blocked at both molecular chain terminals with dimethylhydrogen siloxy groups; a methylhydrogensiloxane/diphenyl siloxane copolymer blocked at both molecular chain terminals with trimethyl siloxy groups; and a methylhydrogensiloxane/diphenylsiloxane dimethylsiloxane copolymer blocked at both molecular chain terminals with trimethyl siloxy groups.

In contrast, exemplary resinous organohydrogen polysiloxane includes organohydrogenpolysiloxanes (which include branched chain siloxane units selected from at least $SiO_{4/2}$ units (Q units) and $R^3SiO_{3/2}$ units (T units), and include $R^3{}_3SiO_{1/2}$ units (M units), $R^3{}_2HSiO_{1/2}$ units ($M^H$ units), and optionally in some cases, $R^3{}_2SiO_{1/2}$ units (D units) and $R^3HSiO_{1/2}$ units ($D^H$ units), with more specific examples thereof including one or more types of organohydrogenpolysiloxane resins selected from $M^HMQ$ type, $M^HQ$ type, $M^HMT$ type, $M^HT$ type, $M^HMQT$ type, $M^HQT$ type, $M^HMDQ$ type, $M^HMDD^HQ$ type, $M^HDQ$ type, $M^HDD^HQ$ type, $M^HMDT$ type, $M^HMDD^HT$ type, $M^HDT$ type, $M^HDD^HT$ type, $M^HMDQT$ type, $M^HMDD^HQT$ type, $M^HDQT$ type, and $M^HDD^HQT$ type.

Note that in the abovementioned formula, $R^3$ is a methyl group or a phenyl group.

<Component B>

Component B is an inorganic filler which imparts optical functions such as light diffusion properties or wavelength conversion to a cured product obtained by the curable composition according to the present invention. The inorganic filler is not limited to a specific inorganic filler as long as effects such as light diffusing effects or wavelength conversion may be obtained when combined with the organopolysiloxane according to the present invention. The filler used in the curable composition according to the present invention is preferably a combination of one or two or more selected from the group consisting of spherical silica particles, spherical alumina particles, and fluorescent fillers. Using the inorganic filler in an amount of 30 to 95 mass % based on the total mass of the curable organopolysiloxane composition according to the present invention, a cured product having excellent optical effects and good balance of mechanical properties can be obtained. The amount of inorganic filler is preferably 40 to 95 mass %, particularly preferably 50 to 92.5 mass % of the total mass of the composition.

[Spherical Silica Particles]

Silica particles are known to have irregular shapes and spherical shapes. Although particles of any shape may be used as long as the light diffusion properties of the cured product obtained by the curable organopolysiloxane composition according to the present invention can be improved. However, spherical silica particles are preferably used in the curable composition according to the present invention. Particularly preferred spherical silica particles are spherical fused silica particles spheroidized via a melting method, for example, spherical fused silica particles obtained by spheroidizing pulverized fine powdered silica in a flame, with commercially available particles capable of being used. When used in the present invention, spherical silica particles, particularly spherical fused silica particles, are preferably used which have an average particle size of 1 to 10 μm, particularly 2 to 5 μm ($d_{50}$), as measured by, for example, the Coulter method or the laser diffraction diffusion method.

[Spherical Alumina Particles]

Particles of any shape may be used as long as the light diffusion properties of the cured product obtained by the curable organopolysiloxane composition according to the present invention can be improved. However, the alumina particles used in the present invention are preferably spherical. Particularly preferred spherical alumina particles are spherical fused alumina particles spheroidized via a melting method in which pulverized fine powdered alumina particles are melted and spheroidized in a flame, with commercially available particles capable of being used. When used in the present invention, spherical alumina particles, particularly spherical fused silica particles, are preferably used which have an average particle size of 1 to 10 μm, particularly 2 to 5 μm ($d_{50}$), as measured by, for example, the Coulter method or the laser diffraction diffusion method.

<Fluorescent Filler>

A fluorescent filler (phosphor) is preferably used as the inorganic filler used in component B according to the present invention. The film or sheet or coating layer containing the fluorescent filler obtained by the curable composition according to the present invention also functions as a wavelength conversion material, and when disposed on a light source, the wavelength of light from the light source can be converted. Moreover, the use of a fluorescent filler can impart light diffusion properties. There is no particular limitations to this phosphor, with examples thereof including yellow, red, green, and blue light phosphors, which include oxide phosphors, oxynitride phosphors, nitride phosphors, sulfide phosphors, oxysulfide phosphors, and the like, which are widely used in light emitting diodes (LEDs) and organic electroluminescence elements (OLEDs). Examples of the oxide phosphors include: yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions.

Exemplary sulfide phosphors include ZnS green light phosphors containing copper ions or aluminum ions. Exemplary oxysulfide phosphors include $Y_2O_2S$ red light phosphors containing europium ions. One type or a combination of two or more types of these phosphors can be used in the curable organopolysiloxane composition according to the present invention. Commercially available phosphors can also be used.

<Component C>

Component C is an organosilicon compound different from component A, the organosilicon compound being one or more types selected from the group consisting of the following C1 and C2:

C1) an organosilicon compound different from component A, the organosilicon compound having: a reactive functional group capable of bonding to a reactive group contained in component A; and a hydrolyzable silyl group and/or a silicon atom-bonded hydroxyl group, in addition to having two or more silicon atoms in the molecule; and C2) an organosilicon compound different from component A, the organosilicon compound having: a reactive functional group having three or more carbon atoms capable of bonding to a reactive group contained in component A; and a hydrolyzable silyl group and/or a silicon atom-bonded hydroxyl group, in addition to having one or more silicon atoms in the molecule, By combining component C with components A and B, the breaking elongation can be significantly improved while maintaining the physical properties of the cured product obtained from the curable composition according to the present invention, for example, the breaking strength, particularly hardness. Specifically, compared with the curable organopolysiloxane composition having the same components except for not containing component C, the curable organopolysiloxane composition containing component C is expected to have an improved breaking elongation value of 10% or more, suitably 20% or more. Further, as a result of improving the breaking elongation, the high temperature durability, particularly the thermal shock resistance, of the cured product is advantageously improved, while deformation and cracking of the cured product, peeling off from the member, etc. can be prevented with respect to rapid changes in temperature (heat shock).

Component (C) is preferably an organosilicon compound represented by the following general Formula (7):

$$(R^aR^b{}_2SiO)_p\text{—}K\text{—}(SiR^b{}_2\text{—}Y\text{—}Si(R^b)_q(OR^c{}_{3-q}))_r \qquad (7)$$

This compound is an example of a compound of C1 described above and is also an example of a compound of C2 described above when $R^a$ is a radical reactive group or hydrosilylation reactive group containing three or more carbon atoms.

In Formula (7):

$R^a$ represents a reactive group which may be bonded to a radical reactive group and/or hydrosilylation reactive group contained in component A. When component A has a radical reactive group, $R^a$ is also preferably a radical reactive group which may react with the radical reactive group. For example, $R^a$ may be a group selected from: alkenyl groups having 2 to 20 carbon atoms, such as vinyl groups, allyl groups, butenyl groups, pentenyl groups, hexenyl groups, heptenyl groups, octenyl groups, nonenyl groups, decenyl groups, undecenyl groups, and dodecenyl groups; acryl-containing groups such as 3-acryloxypropyl groups and 4-acryloxibutyl groups; and methacryl-containing groups such as 3-methacryloxypropyl groups and 4-methacryloxibutyl groups. In addition, when the radical reactive group contained in component A is an alkenyl group, an acryl-containing group, or a methacryl-containing group, exemplary reactive groups contained in component C include mercapto groups. If component A has hydrosilylation reactive groups, $R^a$ may also be a group which may form a bond with hydrosilylation reactive groups contained in component A, with examples thereof potentially including groups selected from alkenyl groups having 2 to 20 carbon atoms, such as vinyl groups, allyl groups, butenyl groups, pentenyl groups, hexenyl groups, heptenyl groups, octenyl groups, nonenyl groups, decenyl groups, undecenyl groups, and dodecenyl groups, preferably vinyl groups, or silicon-bonded hydrogen atoms.

$R^b$ independently represents a group selected from the group consisting of a monovalent hydrocarbon group, a halogenated hydrocarbon group, and a cyanoalkyl group Examples of $R^b$ include: alkyl groups having 1 to 10 carbon atoms, such as a methyl group, ethyl group, propyl group, butyl group, and octyl group; cycloalkyl groups such as a cyclopentyl group and cyclohexyl group; substituted or unsubstituted aryl groups such as a phenyl group, tolyl group, and naphthyl group; aralkyl groups such as a benzyl group, phenylethyl group, and phenylpropyl group; halogenated hydrocarbon groups such as a trifluoropropyl group and chloropropyl group; and cyanoalkyl groups such as a β-cyanoethyl group and γ-cyanopropyl group. $R^b$ is independently preferably a methyl group or a phenyl group, particularly preferably a methyl group.

$R^c$ is independently a hydrogen atom or a group selected from the group consisting of an alkyl group having 1 to 10 carbon atoms and an alkoxyalkyl group having a total of 2 to 10 carbon atoms. Exemplary alkyl groups include a methyl group, an ethyl group, a propyl group, a butyl group, a hexyl group, an octyl group, etc. Moreover, exemplary alkoxyalkyl groups include a methoxymethyl group, methoxyethyl group, ethoxyethyl group, etc. $R^C$ is independently preferably a hydrogen atom, a methyl group, or an ethyl group.

In Formula (7), K represents an organosilane block or a straight chain or branched chain organopolysiloxane block represented by the average composition formula:

$$(R^b{}_3SiO_{1/2})_s(R^b{}_2SiO_{2/2})_t(R^bSiO_{3/2})_u(SiO_{4/2})_v(OR^c)_w.$$

In the formula, $R^b$ and $R^c$ are as defined for Formula (7). It represents a straight chain or branched chain organopolysiloxane chain or silicone resin structure block, wherein s, t, u, v, and w each represent the number of each unit, each representing a number of 0 to 500, with the proviso that not all of t, u, and v are 0; however, the value of s+w is u+2v or less);

In Formula (7), Y is an oxygen atom, a divalent hydrocarbon group, or a group represented by the general formula:

[Formula 5]

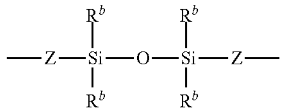

(8)

(wherein, $R^b$ is as defined above and Z is a divalent hydrocarbon group.)

The divalent hydrocarbon group represented by Z is preferably independently an alkylene group having 1 to 10 carbon atoms and particularly preferably selected from a methylene group, an ethylene group, a propylene group, a butylene group, and a hexylene group.

In Formula (7), within a range possible depending on the structure of K, p represents a number of 1 to 10, r represents a number of 1 to 10, and q represents a number of 0 to 2.

In one aspect, K in Formula (7) may be absent, that is, K may represent a single bond, while p and r may be 1. In this case, the compound of Formula (7) is represented by the following formula:

$$R^aR^b{}_2SiO—SiR^b{}_2—Y—Si(R^b)_q(OR^c)_{3-q} \qquad (9)$$

In Formula (9), $R^a$, $R^b$, $R^c$, Y, and q are as defined for Formula (7).

The compound of Formula (7) above is particularly preferably an organosilicon compound represented by the following structural formula:

[Formula 6]

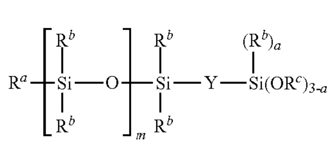

(10)

In Formula (10), $R^a$, $R^b$, $R^c$, and Y are as defined in Formula (7). $R^a$ is particularly preferably a vinyl group or a hydrogen atom. $R^b$ is preferably an alkyl group having 1 to 10 carbon atoms, such as a methyl group, ethyl group, propyl group, butyl group, and octyl group, particularly preferably a methyl group.

In Formula (10), m is preferably a number within a range of 0 to 500 and particularly preferably, m is a number such that the viscosity of the compound at 25° C. is 20 to 1,000,000 mPa·s. When the compound of Formula (10) is a mixture of compounds having different molecular structures, for example a mixture of two or more compounds having different average values of m, the value of m is preferably a value such that the viscosity of the mixture is the above-mentioned viscosity.

In Formula (10), Y is as defined for Formula (7). a is 0, 1, or 2, preferably 0 or 1, and particularly preferably 0.

A particularly preferred compound of Formula (10) is represented by the following chemical formula:

$$Vi(CH_3)_2Si—(OSi(CH_3)_2)_n—OSi(OCH_3)_3$$

wherein Vi represents a vinyl group and n is 1 to 50, preferably 2 to 30, and further preferably 3 to 25.

An organosilicon compound represented by Formula (7) or (10) can be manufactured in accordance with a known method, for example, the manufacturing method described in JP H4-13767 A and JP S63-270762 A.

Note that the organosilicon compound preferably has a low or substantially no content of a molecular weight siloxane oligomer (octamethyltetrasiloxane (D4), decamethylpentasiloxane (D5)).

Examples of particularly preferred compounds among the compounds represented by Formula (7) or (10) are organosilicon compounds represented by the following formula:

$$R^a(Me)_2Si—(OSiMe_2)_n\text{-}Si(OMe)_3 \qquad (11)$$

In Formula (11), $R^a$ is a radical reactive or hydrosilylation reactive functional group, Me represents a methyl group, and n represents a number of 1 to 100, preferably 2 to 50, and particularly preferably 3 to 30. Note that when the compound of Formula (11) is a mixture of different compounds of n, n represents the average value.

Moreover, in Formula (11), $R^a$ is particularly preferably a vinyl group or a hydrogen atom, wherein the vinyl group is a radical reactive and/or hydrosilylation reactive group, while the hydrogen atom is a hydrosilylation reactive group.

Examples of the C2 compound described above include: compounds having three or more carbon atoms in the $R^a$ group having radical reactive and/or hydrosilylation reactive groups in each of the organosilicon compounds described above; and compounds represented by the following general formula:

$$R^a(R^b)_qSi(OR^c)_{3-q} \qquad (7').$$

In Formula (7'), $R^a$ represents a reactive functional group having three or more carbon atoms which can react and bond to the reactive group contained in component A, and $R^b$, $R^c$, and q have the meanings defined for Formula (7). In Formula (7'), $R^a$ is preferably an terminal unsaturated alkenyl group having three or more carbon atoms, with examples thereof including allyl and hexenyl. $R^b$ is preferably a group selected from a methyl group and an phenyl group, particularly preferably a methyl group. $R^c$ is preferably a group selected from a methyl group and an ethyl group, particularly preferably a methyl group. q is particularly preferably 0. While not limited thereto, specific compounds represented by Formula (7') include allyltrimethoxysilane, allyl triethoxirane, hexenyl trimethoxirane, hexenyl triethoxysilane, methacrylpropyl trimethoxirane, methacrylpropyl triethoxirane, acrylpropyl trimethoxirane, acrylpropyl triethoxirane, etc.

Both the abovementioned components C1 and C2 can be used as component C according to the present invention. However, because component C1 is normally a nonvolatile component, a stable surface treatment can be carried out on component B and the technical effect of the present invention can be more stably achieved with a smaller amount of usage than the case in which volatile component C is used. Note that C1 and C2 components are preferably substantially nonvolatile components having a boiling point of 200° C. or higher at 25° C. and one atmosphere.

[Curing Accelerator]

The curable organopolysiloxane composition according to the present invention contains components A, B, and C as essential components, as described above; however, a curing accelerator or a curing catalyst to accelerate the curing reaction involving the reactive groups contained in components A and C may be added to the composition. Moreover, the curable composition according to the present invention may be any one of an aspect in which it is cured by heating including normal temperature, an aspect in which it is cured using a high energy beam such as ultraviolet light, or an aspect in which it is cured using combinations thereof.

<Radical Polymerization Initiator>

When component A has a radical reactive functional group, a radical polymerization initiator may be added to the composition as a radical initiator to accelerate curing of the curable composition. Known thermal radical polymerization initiators such as azo compounds and organic peroxides can be used as radical polymerization initiators. While not limited thereto, exemplary organic peroxides include alkyl based peroxides and/or acyl based peroxides such as benzoyl peroxide, 2,4-dichlorobenzoyl peroxide, p-chlorobenzoyl peroxide, dicumyl peroxide, ditert-butyl peroxide, 2,5-dimethyl-2,5-di(tert-butylperoxyl)hexane, etc. While not limited thereto, exemplary azo compounds include 2,2'-azobisisobutyronitrile, 2,2'-azobis-2-methylbutyronitrile, 2,2'-azobis-2,4-dimethylvaleronitrile, 4,4-azobis-4-cyanovaleric acid, etc. The thermal radical polymerization initiator uses an equimolar amount or more, preferably an amount of 2-fold or more, relative to the number of mols of radical reactive groups contained in component A in the curable organopolysiloxane composition according to the present invention. If a thermal radical polymerization initiator is used, the composition may be heated to cure the curable composition.

A photoradical polymerization initiator may be used with or instead of a thermal radical polymerization initiator. A known initiator can be used as the photo radical polymerization initiator and is not particularly limited. While not limited thereto, specific examples of photoradical polymerization initiators include acetophenone, benzophenone, o-benzoylbenzoic acid, p-benzoylbenzoic acid, 2,2-diethoxyacetophenone, 2,4-diethyl-9H-thioxanthene-9-on, 4,4'-dimethoxybenzyl, 2,2-dimethoxy-2-phenylacetophenone, 2-ethoxy-2-phenylacetophenone, 2-ethylanthraquinone, 1-hydroxycyclohexyl phenyl ketone, 2-(hydroxyimino)propiophenone, 2-hydroxy-2-methylpropiophenone, 2-isopropoxy-2-phenylacetophenone, 2-methyl-4'-(methylthio)-2-morpholino propiophenone, p, p'-tetramethyl diamino benzophenone, etc. Moreover, initiators such as Omnirad 651, 184, 1173, 2959, 127, 907, 369, 369E, and 379EG (alkylphenone based photopolymerization initiators, IGM Resins B.V.), Omnirad TPO H, TPO-L, and 819 (acyl phosphine oxide based photopolymerization initiators, IGM Resins B.V.), Omnirad MBF and 754 (intramolecular hydrogen abstraction type photoinitiators, IGM Resins B.V.), and Irgacure OXE01 and OXE02 (oxime ester based photopolymerization initiators, BASF) may be used. If a photoradical polymerization initiator is used, the curable composition may be irradiated with a high energy beam, for example, an ultraviolet, X-ray, or electron beam. Moreover, if the radical reactive groups contained in component A undergo a sufficient crosslinking reaction only by irradiating with high energy beams, the curable composition according to the present invention may be cured only by irradiating with high energy beams without using photoradical initiators. When a photoradical polymerization initiator is used, a photosensitizer may be used in addition thereto. It is known that by using a sensitizer, the light quantum efficiency of the polymerization reaction can be increased and, compared with the case in which only a photoinitiator is used, light with a longer wavelength can be utilized; therefore, if the coating thickness of the composition is relatively thick, or a relatively long wavelength LED light source for photoirradiation is used, it is particularly effective. While not limited thereto, exemplary known sensitizers include anthracene based compounds, phenothiazine based compounds, perylene based compounds, cyanine based compounds, melocyanine based compounds, coumarin based compounds, benzylidene ketone based compounds, and (thio) xanthene or (thio)xanthone based compounds such as isopropylthioxanthone, 2,4-diethylthioxanthone, squarylium based compounds, (thia)pyrylium based compounds, porphyrin based compounds, etc., with any photosensitizer capable of being used in the curable composition according to the present invention.

While the amount of the photoinitiator added to the composition according to the present invention is not particularly limited as long as the intended photoradical polymerization reaction occurs, it is generally used in an amount of 0.01 to 5 mass %, preferably 0.05 to 1 mass %, relative to the total mass of the curable composition according to the present invention.

Moreover, a photosensitizer may be used in combination with the photocationic polymerization initiator or the photoradical polymerization initiator. Exemplary photosensitizers include anthracene based compounds, phenothiazine based compounds, perylene based compounds, cyanine based compounds, melocyanine based compounds, coumarin based compounds, benzylidene ketone based compounds, and (thio)xanthene or (thio)xanthone based compounds such as isopropylthioxanthone, 2,4-diethylthioxanthone, squarylium based compounds, (thia) pyrylium based compounds, porphyrin based compounds, etc.

When component A has a radical reactive group, component C has a group reactive with its radical reactive group. The reactive group contained in component C is preferably reacted with the radical reactive group contained in component A under conditions in which component A is subjected to a radical polymerization reaction.

<Hydrosilylation Reaction Catalyst>

When component A or components A and C have a hydrosilylation reactive functional group, a hydrosilylation reaction catalyst may be added to the composition according to the present invention to accelerate curing of the composition. In the curable composition according to the present invention, (i) a hydrosilylation reaction catalyst which exhibits activity in the composition without irradiating with a high energy beam;

(ii) a hydrosilylation reaction catalyst which does not exhibit activity without irradiating with a high energy beam, but exhibits activity in the composition by irradiating with a high energy beam; or (iii) combinations of (i) and (ii)

can be used. When curing the curable composition according to the present invention at room temperature or by heating, it is preferable to use catalyst (i); in contrast, when accelerating curing of the curable composition by irradiation with high energy beams, it is preferable to use catalyst (ii) in addition to catalyst (i). When the curable composition according to the present invention is cured by irradiation with high energy beams, catalyst (ii) can be used. When the catalysts (i) and (ii) are used in combination, the addition amount of catalyst (i) and catalyst (ii) to the curable composition is preferably within a range of 100/0 to 5/95 (catalyst (i)/catalyst (ii)).

High energy beams include ultraviolet rays, X-rays, and electron beams, among which ultraviolet rays are preferably used because the efficiency of catalyst activation is high. Furthermore, in irradiating with a high energy beam, the amount of irradiation therewith varies depending on the type of high energy beam activated hydrosilylation reaction catalyst; however, in the case of ultraviolet rays, the integrated amount of irradiation at a wavelength of 365 nm is preferably within a range of 100 $mJ/cm^2$ to 10 $J/cm^2$.

The abovementioned catalyst (i) is a hydrosilylation catalyst which can activate a hydrosilylation reaction without irradiating high energy beams. By using catalyst (i), the curable composition according to the present invention can be provided with quick curable/quick drying curing profile when the hydrosilylation reaction inhibitor is not included or the amount of an inhibitor is small. Exemplary hydrosilylation reaction catalysts of catalysts (i) include platinum based catalysts, rhodium based catalysts, palladium based catalysts, nickel based catalysts, iridium based catalysts, ruthenium based catalysts, and iron based catalysts, with platinum based catalysts preferable. Examples of platinum based catalysts include platinum based compounds, such as platinum fine powders, platinum black, platinum-supporting silica fine powders, platinum-supporting activated carbon, chloroplatinic acids, alcohol solutions of chloroplatinic acids, olefin complexes of platinum, alkenylsiloxane complexes of platinum, and the like. Alkenylsiloxane complexes of platinum are particularly preferable. Exemplary alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of the methyl groups of the alkenylsiloxanes with an ethyl group, a phenyl group, or the like; and alkenylsiloxanes obtained by substituting a portion of the vinyl groups of these alkenylsiloxanes with an allyl group, a hexenyl group, or the like. The platinum-alkenyl siloxane complex has favorable stability, so 1,3-divinyl-1,1,3,3-tetramethyldisiloxane is particularly preferable. Furthermore, the stability of the platinum-alkenylsiloxane complex can be improved. Therefore, 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, and 1,3,5,7-tetramethyl-1,3,5,7-tetravinylcyclotetrasiloxane, or other alkenylsiloxane or dimethylsiloxane oligomers or other organosiloxane oligomers are preferably added to the complex, with an alkenylsiloxane particularly preferably added to the complex.

Catalyst (i) is a catalyst that is active without irradiating with a high energy beam, with a catalyst that is active even at relatively low temperatures more preferable. Specifically, the composition exhibits activity in the curable composition according to the present invention at a temperature range of 0 to 200° C. to accelerate the hydrosilylation reaction. The content of component (i) varies depending on the type of catalyst and the type of composition, but is usually an amount such that the metal atoms in the catalyst are within a range of 0.01 to 50 ppm based on mass units relative to the curable composition; wherein, when the platinum content is preferably within a range of 1.5 to 30 ppm particularly using an alkenyl siloxane complex of platinum, quick curability/quick dryness can be imparted to the curable composition according to the present invention. When the addition amount of catalyst (i) is too small, the curing time of the curable composition increases; in contrast, when the addition amount is too large, the usable life is too short and may cause practical inconveniences and increase costs, which is not preferable.

Catalyst (ii) is a hydrosilylation reaction catalyst which does not exhibit activity without irradiating with a high energy beam, but exhibits activity in the present composition by irradiating with a high energy beam and is referred so as a so-called a high energy beam activation catalyst or photoactivation catalyst.

Specific examples of catalyst (ii) include (methylcyclopentadienyl) trimethyl platinum (IV), (cyclopentadienyl) trimethyl platinum (IV), (1,2,3,4,5-pentamethyl cyclopentadienyl) trimethyl platinum (IV), (cyclopentadienyl) dimethylethyl platinum (IV), (cyclopentadienyl) dimethylacetyl platinum (IV), (trimethylsilyl cyclopentadienyl) trimethyl platinum (IV), (methoxycarbonyl cyclopentadienyl) trimethyl platinum (IV), (dimethylsilyl cyclopentadienyl) trimethylcyclopentadienyl platinum (IV), trimethyl (acetylacetonato) platinum (IV), trimethyl (3,5-heptanedionate) platinum (IV), trimethyl (methylacetoacetate) platinum (IV), bis(2,4-pentanedionato) platinum (II), bis(2,4-hexanedionato) platinum (II), bis(2,4-heptanedionato) platinum (II), bis(3,5-heptanedionato) platinum (II), bis(1-phenyl-1,3-butanedionato) platinum (II), bis(1,3-diphenyl-1,3-propanedionato) platinum (II), and bis(hexafluoroacetylacetonato) platinum (II). Of these, (methylcyclopentadienyl) trimethyl platinum (IV) and bis(2,4-pentanedionato) platinum (II) are preferred from the perspective of versatility and ease of acquisition.

Catalyst (i) and catalyst (ii) can be used in combination as a catalyst for curing the curable composition according to the present invention. For example, the hydrosilylation reaction product obtained by the abovementioned catalyst (i) can be provided with secondary curability by irradiating with high energy beams (hereinafter, also referred to as "photocurable"); in addition, by irradiating with high energy beams in the presence of catalysts (i) and (ii), a curing reaction can be accelerated by catalyst (i) even at sites not subjected to sufficient light irradiation, allowing a further curing reaction to proceed for the reaction products which have cured by the time they become non-fluid. Moreover, a combined use of catalyst (ii) compared with a single use of catalyst (i) may enable the achievement of further quick curability/quick dryness. The addition amount of catalyst (ii) is the amount necessary to further cure a composition to the reaction product obtained by the abovementioned component (i), or a sufficient amount to improve quick curability/quick dryness, and is preferably an amount in which metal atoms in the catalyst are within a range of 1 to 50 ppm by mass units, preferably within a range of 5 to 30 ppm, with regard to the present composition.

In such a composition design for a curable composition having high energy beam curability, for example, photocurability, in addition to curability at room temperature, the mass ratio of catalyst (i) to catalyst (ii) is preferably within a range of 90/10 to 5/95, more preferably within a range of 85/15 to 10/90. This is because, when the mass ratio is the abovementioned upper limit or less, the effect of increasing the curing reaction speed due to high energy beam irradiation can be obtained, while when the mass ratio is less than the abovementioned lower limit, the curing reaction does not proceed sufficiently at relatively low temperatures such as room temperature for a short period of time, that is, curing profiles of quick curability/quick dryness may not be achieved. Moreover, after applying the curable composition according to the present invention to a substrate, etc., the curable composition can be irradiated with ultraviolet rays using a spot UV light source, such that the composition does not flow.

When the curable composition according to the present invention is a composition which cures via a hydrosilylation reaction, a hydrosilylation reaction inhibitor may be used as necessary. Hydrosilylation reaction inhibitors are usually used to improve the pot life of the curable composition. Exemplary compounds capable of being used as a hydrosilylation reaction inhibitor in the curable compositions according to the present invention include: alkyne alcohols such as 2-methyl-3-butyne-2-ol, 3,5-dimethyl-1-hexyne-3-ol, and 2-phenyl-3-butyne-2-ol; enyne compounds such as 3-methyl-3-pentene-1-yne and 3,5-dimethyl-3-hexene-1-yne; 1,3,5,7-tetramethyl-1,3,5,7-tetravinyl cyclotetrasiloxane; 1,3,5,7-tetramethyl-1,3,5,7-tetrahexenyl cyclotetrasiloxane; and benzotriazole. While not limited thereto, the usage amount of the reaction inhibitor is preferably within the range of 0.0001 to 5 mass parts relative to 100 mass parts of the total curable composition according to the present composition.

When component A or components A and C forming the curable composition according to the present invention have hydrosilylation reactive groups, the amount of each component is preferably such that the amount of silicon-bonded hydrogen atoms is within a range of 0.1 to 10 mols, suitably within a range of 0.2 to 5.0 mols, and particularly suitably within a range of 0.5 to 2.0 mols, with respect to one mol of a carbon-carbon double bonds which are hydrosilylation reactive groups. If the amount of silicon-bonded hydrogen atoms is 0.1 mol or less per 1 mole of the hydrosilylation reactive carbon-carbon double bond, the curable composition may not sufficiently cure. Moreover, if the amount of silicon atom-bonded hydrogen atoms per 1 mol of the hydrosilylation reactive carbon-carbon double bond exceeds 10 mol, the obtained cured product may become too hard or the breaking elongation of the cured product may decrease.

<Condensation Reaction Catalyst>

To the curable composition according to the present invention, a condensation reaction catalyst may be added to accelerate the reaction between the hydrolyzable silicon group and/or the silicon atom-bonded hydroxyl group contained in component C and the inorganic filler of component B. The type of condensation reaction catalyst for use in the present invention is not particularly limited, with examples thereof including: organotin compounds such as dibutyltin dilaurate, dibutyltin diacetate, octenoic acid tin, dibutyltin dioctate, and laurate tin; organotitanium compounds such as tetrabutyl titanate, tetrapropyl titanate, and dibutoxybis (ethyl acetoacetate)titanium; in addition, acidic compounds such as hydrochloric acid, sulfuric acid, and dodecylbenzene sulfonic acid; alkaline compounds such as ammonia and sodium hydroxide; amine based compounds such as 1,8-diazabicyclo[5.4.0]undecene (DBU) and 1,4-diazabicyclo [2.2.2]octane (DABCO); organozirconium esters such as zirconium tetrapropylate and zirconium tetrabutylate; organozirconium chelates such as zirconium tributoxy acetylacetonate, zirconium butoxyacetylacetonate bisethylacetoacetate, and zirconium tetraacetylacetonate; zirconium based condensation cocatalysts of oxozirconium compounds such as zirconium bis(2-ethyl hexanoate)oxide and zirconium acetylacetonate(2-ethyl hexanoate)oxide; aluminum alcoholate such as aluminum triethylate, aluminum triisopropylate, and aluminum tri(sec-butylate); aluminum chelate compounds such as diisopropoxy aluminum(ethyl acetoacetate)aluminum tris(ethyl acetoacetate), and aluminum tris(acetylacetonate); and aluminum based condensation cocatalyst of aluminum acyloxy compounds such as hydroxy aluminum bis(2-ethyl hexanoate), with organotin compounds and organotitanium compounds preferable. The amount of the condensation reaction catalyst to be used is not particularly limited and can be any amount within a range in which the object of accelerating a condensation reaction is achieved. Note that the use of the condensation reaction catalyst is optional and does not need to be used in the present composition.

[Other Additives]

If necessary, organopolysiloxanes other than the abovementioned component A, inorganic fillers other than the abovementioned component B, an organic resin fine powder such as a polymethacrylate resin, an adhesion imparting agent, a heat resistant agent, a dye, a pigment, a flame retarder, a solvent, etc. may be added to the curable organopolysiloxane composition according to the present invention. These additives are known to those of skill in the art, and the addition amounts and addition methods thereof can be any amount and any method as long as they does not impair the object of the present invention.

Note that in addition to particles as component B selected from the group consisting of the abovementioned spherical silica particles, particularly preferably spherical fused silica particles, spherical alumina particles, particularly preferably spherical fused alumina particles, and fluorescent fillers, titanium oxide particles having an average particle size of 0.1 to 10.0 μm, etc. can be used as additional inorganic fillers. Such additional inorganic fillers may be blended into the curable composition for the purpose of further improving the reflection diffusion effect of the cured product obtained by curing the curable composition according to the present invention.

[Properties of the Cured Product Obtained by the Curable Composition According to the Present Invention]

The light transmittance of the cured product obtained by curing the curable organopolysiloxane composition according to the present invention is preferably 40% or more. The light transmittance is a value determined by mounting an integrating unit having a diameter of 150 mm on an ultraviolet visible near-infrared spectrophotometer for a wavelength range (full range) of visible light. Further, the cured product preferably has light diffusion properties such that upon determining light diffusing properties using a Scattering Profiler for bidirectional transmittance distribution function determination equipped with a white light source (in particular, a white LED by a combination of a blue LED and a yellow phosphor); in a bidirectional transmittance distribution function, when the linear transmitted light intensity is 1, the transmitted light intensity at a light receiving position inclined by 45 degrees with respect to the linear transmitted light with a determination sample at its center is 0.65 or more. Note that the bidirectional transmittance distribution function (BTDF) is a function inherent in a transmission position which represents how much light component is transmitted and travels in each direction when light is incident from a direction in a position.

Moreover, the cured product obtained by the curable organopolysiloxane composition according to the present invention can be preferably expected to improve breaking elongation of the cured product by 10% or more, and suitably 20% or more, compared with the cured product obtained by a curable organopolysiloxane composition having the same components except for component C. In particular, in the cured product according to the present invention, the breaking elongation is significantly improved without significantly changing the breaking strength by combining components A and C compared with a curable composition which contains component A but does not use component C, wherein the mechanical durability and thermal shock resistance thereof can be improved while maintaining the hardness of the cured product, and wherein the obtained cured product is tough against physical and thermal shock, and advantageously tends not to cause cracking or deformation. Note that the breaking elongation value of the cured product can be designed to the desired value by changing the components of the curable composition, but may be within a range of 1 to 50%; the formulation of the curable composition may be designed such that the breaking elongation is within a range of is 1 to 10% while maintaining hardness relatively high; or the formulation of the curable composition may be designed to provide a somewhat soft cured product having a breaking elongation value exceeding 10%.

Moreover, the cured product according to the present invention preferably has a hardness ranging from Shore A hardness 40 to Shore D hardness 90. As the amount of radical reactive groups or hydrosilylation reactive groups contained per unit volume or unit mass of the curable composition according to the present invention increases, the hardness of the resulting cured product generally increases. Consequently, the hardness of the cured product can be adjusted by adjusting the amount of the reactive groups contained in the curable composition. Moreover, the Shore a or Shore D hardness of the cured product can be adjusted depending on the proportion of the inorganic filler of component B contained in the curable composition. By providing the abovementioned hardness and improved breaking elongation, the cured product according to the present invention can be used as a bulk material which can be handled alone, such as a film or sheet.

[Use of the Cured Product According to the Present Invention, Etc.]

The use of the curable organopolysiloxane composition according to the present invention is not particularly limited. Examples of the use of the composition according to the present invention include adhesives, sealants, protective agents, coating agents, underfill agents, etc., for electric/electronic uses, and it can be particularly used as a member requiring light diffusion. Particularly preferred applications of the curable compositions according to the present invention include optical members, specifically, optical members requiring light diffusion properties. Further specific applications thereof include light diffusion films or coating agents for light receiving sensors, specifically, light diffusion films and light diffusing coating agents for light receiving sensors. Another specific application suitable for the curable composition according to the present invention includes a sealing agent for light emitting diodes. The present invention also provides an optical apparatus including an optical member formed using the curable composition according to the present invention, such as a light receiving sensor and a light emitting diode. Light emitting diodes include both inorganic light emitting diodes (LEDs) and organic light emitting diodes (OLEDs).

When the curable composition according to the present invention is used as an optical member of a light emitting diode, and particularly as a sealing agent, the inorganic filler of component B is particularly preferably a fluorescent filler (phosphor).

The cured product obtained by the curable organopolysiloxane composition according to the present invention has hardness and mechanical properties suitable for use as a bulk material, such as a separate film or sheet itself, when 10 mol % or more of the overall groups bonded to silicon atoms of the organopolysiloxane are aryl groups, particularly preferably phenyl groups. When the curable composition according to the present invention is used as an optical member such as a light diffusion film or sheet, generally, the thickness of the cured product obtained by the curable composition is particularly preferably 100 to 1000 μm. When forming a film or sheet from the curable organopolysiloxane composition according to the present invention, if the viscosity of the composition has a viscosity suitable for applying a film or sheet onto a releasable substrate, for example, it can be used without being diluted with a solvent. Moreover, the viscosity of the compositions according to the present invention can also be diluted with a solvent to provide a viscosity suitable for applying the composition onto a releasable substrate. Consequently, the present invention provides a coating agent including the abovementioned curable organopolysiloxane composition and a solvent, specifically, an organic solvent. This coating agent can be used to form a coating layer including a cured product of the curable composition according to the present invention on a substrate, and the coating layer is not particularly limited, but can be, for example, a light diffusing layer of an optical member.

The cured product obtained by the curable organopolysiloxane composition according to the present invention can be used as a member of the desired form. However, when used as an optical member, the cured product is preferably a film-like or sheet-like or thin film, and particularly preferably a coating thin film. For example, the curable composition according to the present invention can be used to provide a film-like or sheet-like cured product having a film thickness within a range of 5 to 2000 μm, and preferably 100 to 1000 μm, or a solid silicone material in the form of a coating film.

Moreover, when the curable organopolysiloxane composition according to the present invention is used as a light diffusing material, and used as an inorganic filler of component B, particularly spherical silica particles, particularly spherical fused silica particles, and/or particularly spherical alumina particles, and particularly spherical fused alumina particles, the thickness of the film or sheet or coating layer formed from the cured product according to the present invention is preferably within a range of 3 L to 200 L (μm) with respect to the particle size L (μm) of the filler.

The hardness of the solid silicone material which forms the film-like or sheet-like material or the coating layer is also dependent on the substrate, and therefore is not particularly limited. However, the hardness of the cured product obtained by the curable composition according to the present invention is preferably practically 2B or more in pencil hardness, or within a range of Shore A hardness 40 to Shore D hardness 90.

<Coating Agent>

The curable organopolysiloxane composition according to the present invention can be used as a coating solution dissolved and suspended in an organic solvent to form a film-like or sheet-like cured product or to form a coating film on the substrate. While not particularly limited thereto, as long as the type of organic solvent arbitrarily used to prepare a coating liquid is a compound which may dissolve all components of components A and C in the composition or a portion of the components, a type having a boiling point of 0° C. or more and less than 200° C. at one atmosphere (0.1013 MPa) is preferably used. Exemplary solves capable of being used include non-halogen solvents such as i-propyl alcohols, t-butyl alcohols, cyclohexanols, cyclohexanones, methyl ethyl ketones, methyl isobutyl ketones, toluenes, xylenes, mesitylenes, 1,4-dioxanes, dibutyl ethers, anisoles, 4-methyl anisoles, ethyl benzenes, ethoxy benzenes, ethylene glycols, ethylene glycol dimethyl ethers, ethylene glycol diethyl ethers, 2-methoxy ethanols (ethylene glycol monomethyl ethers), diethylene glycol dimethyl ethers, diethylene glycol monomethyl ethers, ethyl acetates, butyl acetates, propyl propionates (also referred to as "propyl propionate"), 1-methoxy-2-propyl acetates, 1-ethoxy-2-propyl acetates, octamethyl cyclotetrasiloxanes, and hexamethyl disiloxanes, and halogen solvents such as trifluoromethyl benzenes, 1,2-bis (trifluoromethyl)benzenes, 1,3-bis (trifluoromethyl)benzenes, 1,4-bis (trifluoromethyl)benzenes, trifluoromethyl chlorobenzenes, trifluoromethyl fluorobenzenes, and hydrofluoroethers. The organic solvent can be used independently or as a mixture of two or more types thereof. In particular, i-propyl alcohol, methyl isobutyl ketone, etc. are suitably used.

<Method for Forming the Curable Organopolysiloxane Composition in a Film Form or Sheet Form or Thin Film Form>

The method for forming a solid silicone material (which is a cured product obtained by curing the curable organopolysiloxane composition according to the present invention) into a film form or sheet form or thin film form is not particularly limited, but can be carried out via the following method, for example.

(i) Film Formation by Molding

When the solid silicone material obtained by curing the curable organopolysiloxane composition according to the present invention has hot melt properties, a film can be formed on the desired substrate via a known molding method such as integral molding. Typical molding techniques include transfer molding, injection molding, and compression molding. For example, in transfer molding, the solid silicone material according to the present invention can be filled into a plunger of a molding machine, and automatic molding can be carried out to obtain a film-like or thin film member as a molded product. The molding machine capable of being used can be an auxiliary ram type molding machine, a slide type molding machine, a dual ram type molding machine, or a low pressure enclosure molding machine.

By using a releasable substrate as the substrate, it is possible to obtain a bulk material itself which can be handled in a film or sheet form made of the solid silicone material according to the present invention alone.

(ii) Film Formation by Coating of a Film or Sheet or Thin Film Form Using a Solvent, as Well as by Removing the Solvent and Curing.

The curable organopolysiloxane composition according to the present invention can be uniformly dispersed in an organic solvent such as i-propyl alcohol or methyl isobutyl ketone. Therefore, a dispersion liquid containing the curable organopolysiloxane composition can be coated in a film or sheet form on a desired substrate, the organic solvent can be removed by means such as drying, and a film-like or sheet-like material can be obtained by curing the curable composition. In particular, if the dispersion liquid is coated in a film or sheet form, a solvent is preferably used to adjust the viscosity of the dispersion liquid such that the viscosity of the overall dispersion liquid is within a range of 100 to 10,000 mPa·s. Moreover, if diluted with a solvent, the solvent is preferably used within a range of 2000 mass parts or less with respect to the total amount of the solid content (100 mass parts) contained in the dispersion liquid. As the application method, gravure coating, offset coating, offset gravure, roll coating using an offset transfer roll coater, reverse roll coating, air knife coating, curtain coating using a curtain flow coater or the like, comma coating, meyer bar, spin coating, or other known methods used for the purpose of forming a cured layer may be used without limitation. Moreover, the coating amount of the curable composition on the substrate is any amount, but it can be coated such that the film-like or sheet-like material formed after removing the organic solvent and curing the curable composition has the desired film thickness. Note that, as described below, using a releasable substrate as the substrate on which the dispersion liquid is coated, a film or sheet made from the solid silicone material according to the present invention can be formed on the releasable substrate, and then the film-like or sheet-like bulk material can be obtained by separating the film or sheet from the substrate. Moreover, the curable organopolysiloxane composition according to the present invention can be dissolved and dispersed in an organic solvent and coated directly onto the member of the optical apparatus to remove the solvent, then cured to form a coating film.

In the present invention, by setting the number of mols of aryl groups in the molecule of the organopolysiloxane to 10 mol % or more of the overall organic groups bonded to silicon atoms, it is possible to have hardness and mechanical strength which can be handled as a single film-like or sheet-like material.

<Laminate>

The solid silicone material obtained by curing the curable organopolysiloxane composition according to the present invention can be used as an optical member, particularly in optical apparatuses such as light emitting diodes (LEDs), organic electroluminescence elements (OLEDs), light receiving sensors, etc. In this case, particularly, the solid silicone material obtained by the curable composition according to the present invention is preferably disposed at the interface with the air as a solid layer forming the laminate part in the optical apparatus. At this time, if the laminate is a light emitting device, for example, a light emitting diode or an organic electroluminescence element, it may have a layer containing at least one type of fluorescent filler between the light source and the solid silicone material according to the present invention (hereinafter, also referred to as a "phosphor layer"). Moreover, when the solid silicone material according to the present invention is used as a light diffusing material, particularly a light diffusion coating layer, or a light diffusion film or a sheet to diffuse light incident on a light receiving sensor, spherical fused silica particles and/or spherical fused alumina particles are particularly preferably used as component B.

<Laminate Formed with a Film-Like or Sheet-Like Coating Layer Made from the Solid Silicone Material According to the Present Invention on a Releasable Substrate>

The releasable substrate generally refers to a material which is formed from a substrate and a release layer formed thereon, and capable of easily releasing a film-like or sheet-like material generally formed by a coating method on a release layer.

First, a laminated (in which a film-like or sheet-like material of a solid silicone material formed from the cured product obtained by the curable composition according to the present invention is disposed on the release layer) will be described. The film-like or sheet-like material formed from the solid silicone material according to the present invention, as well as the laminate material including the same, may be desired to be handled in a single form separate from the substrate. When the solid layer formed from the solid silicone material according to the present invention is disposed on the release layer, the film-like or sheet-like material formed from the solid silicone material according to the present invention and a laminate material containing the same can be easily separated from the release layer constituting the releasable substrate together with the substrate and handled. Such a releasable substrate may have a release layer facing the solid layer in a film form, etc. formed from the solid silicone material according to the present invention, and may be optionally provided with another release layer. The following configuration can be exemplified as the configuration of the laminate including the releasable substrate and the solid layer formed from the solid silicone material according to the present invention. Note that in the following examples, "/" means that the respective layers face one another in the lamination direction of the laminate (typically the thickness direction orthogonal to the substrate). In addition, the substrate and the release layer may be an integral unit or the same layer (a substrate provided with material or physical irregularities so as to be releasable).

Example 1: Substrate/release layer/solid layer formed from the solid silicone according to the present invention/any other layers (which may be one layer or two or more layers)

Example 2: Substrate/release layer/solid layer formed from the solid silicone according to the present invention/any other layers (which may be one layer or two or more layers)/release layer/substrate Here, "any other layers" refers to layers which may or may not be used as desired. Moreover, while not limited thereto, examples of any other layers include pressure-sensitive adhesive layers.

In particular, as in Example 2 above, when a film-like or sheet-like material consisting of the solid silicone material according to the present invention, or a laminate material containing the same is configured to be sandwiched between two release layer, the material including the solid layer consisting of the solid silicone material according to the present invention can be transported (including being exported to foreign countries) while being protected by a substrate, a releasable substrate including the release layer can be separated from both sides of the laminate at the desired timing and location, and the film-like or sheet-like material consisting of the solid silicone material according to the present invention, or only the laminate material containing the same can be disposed or laminated on the desired structure, for example, a light source of a light emitting device, or the light incident side of a light receiving sensor, etc. In particular, when the laminate material of the part excluding the releasable substrate is a laminated sheet, etc. comprising a solid layer and phosphor layer made from the solid silicone material according to the present invention, it is possible to improve the handling workability thereof, which is useful.

While not particularly limited thereto, exemplary types of substrates include paperboard, cardboard paper, clay-coated papers, polyolefin laminate papers, particularly polyethylene laminate papers, synthetic resin films and sheets, natural fiber woven materials, synthetic fiber woven materials, artificial leather woven materials, and metal foils. In particular, synthetic resin films and sheets as substrates are preferable, with exemplary synthetic resins including: polyimides, polyethylenes, polypropylenes, polystyrenes, polyvinyl chlorides, polyvinylidene chlorides, polycarbonates, polyethylene terephthalates, cyclopolyolefins, and nylons. The substrate is preferably a film-like or a sheet-like substrate. The thickness of the substrate is not particularly limited and those with a desired thickness can be used in accordance with the application. Note that, the abovementioned substrate itself may be a material that functions as a release layer, and/or may have a structure provided with releasability by forming physically fine irregularities on the surface of the substrate.

The release layer may also be referred to as a release liner, peel layer, or release coating layer, and can be suitably a release layer having a release coating capability such as a silicone release agent, fluorine release agent, alkyd release agent, or fluorosilicone release agent. Alternatively, the substrate may be formed from a material which forms physically fine irregularities on the surface of the substrate, or the substrate is formed from a material which is not easily adhered to the solid silicone material according to the present invention. In these cases, a release layer made from a different material than the substrate may be further formed on the substrate, but there may be no further release layer, and in this case, the release layer refers to a part which indicates the releasability of the surface of the substrate.

The solid layer formed from the solid silicone material according to the present invention can be formed on the release layer of the abovementioned releasable substrate via the same method as described above <Method for forming the curable organopolysiloxane composition in a film form or sheet form or thin film form>. In particular, the curable organopolysiloxane composition according to the present invention is uniformly dispersed in an organic solvent such as i-propyl alcohol or methyl isobutyl ketone according to the abovementioned method, and the obtained liquid is coated on a release layer of a film-like substrate or sheet-like substrate, after which the organic solvent is removed by means such as drying, and a solid layer formed from a film-like or sheet-like solid silicone material is preferably formed on the release layer of the substrate by curing the curable composition. The film thickness of the film-like or sheet-like solid silicone material can be set to a thickness suitable for the intended use. However, when it is used as a light diffusing material, the thickness thereof is generally preferably within a range of 5 to 2000 μm as described above. When the composition according to the present invention is used as a sealing agent for a light emitting diode or organic electroluminescence element, the thickness thereof is preferably within a range of 5 to 2000 μm.

The solid layer formed from the solid silicone material according to the present invention may be used alone, but the solid layer is more preferably a laminate member in which the same or different layers are laminated on the solid layer. In particular, another layer in the laminate member is preferably a cured layer formed by curing an organopolysiloxane having curing reactive functional groups or a solid organopolysiloxane (silicone layer), and is preferably a silicone cured layer (obtained by curing and reacting an organopolysiloxane having hydrosilylation reactive groups and/or radical reactive groups, and condensation or dealcoholizing groups in the presence of a catalyst), or a layer (consisting of a cured product based on an organopolysiloxane having the abovementioned resin linear structure). Here, the organopolysiloxane having a curing reactive group may be linear, branched, cyclic, or resinous, and two or more curing reactions may be used in combination.

Particularly preferably, another silicone layer disposed on the solid layer consisting of the solid silicone material obtained by the curable composition according to the present invention is a cured product based on an organopolysiloxane having the resin linear structure described above. When a solid silicone material obtained by curing the curable composition according to the present invention is used as an optical member for a light emitting diode or organic electroluminescence element, a silicone layer is preferably obtained by dispersing the below-mentioned phosphor in the solid organopolysiloxane.

The other layers in the laminate member may be one or more layers and may be multiple layers with two or more different functions. In addition, the overall thickness of the solid layer formed from the solid silicone material according to the present invention is not particularly limited, however, the thickness is preferably not less than 5 μm, and from the perspective of handleability, the thickness may be within a range of 50 to 10,000 μm and particularly preferably 100 to 1,000 μm.

When a solid silicone material obtained by curing the curable composition according to the present invention is used as an optical member for a light emitting diode or organic electroluminescence element, one or more layers which are laminated on the solid layer made from the solid silicone material according to the present invention, specifically, the silicone layer different from the solid layer, are preferably phosphor layers containing at least one or more types of phosphor. Such a phosphor layer particularly functions as a wavelength conversion material, and when disposed on a light source, the light emission wavelength can be converted. There is no particular limitations to this phosphor, with examples thereof including yellow, red, green, and blue light phosphors, which include oxide phosphors, oxynitride phosphors, nitride phosphors, sulfide phosphors, oxysulfide phosphors, and the like, which are widely used in light emitting diodes (LEDs) and organic electroluminescence elements (OLEDs). Examples of the oxide phosphors include: yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. In the laminate according to the present invention, two or more of these phosphors may be used in combination.

In the abovementioned laminate, the silicone layer that is different from the solid silicone material layer formed from the cured product of the curable composition according to the present invention may be a silicone layer containing a reinforcing filler because it increases the mechanical strength of the silicone layer and improves protective properties thereof as well as the adhesion to the adjacent layer. Moreover, this silicone layer may also be a silicone layer containing a thermally conductive filler or a conductive filler to impart thermal conductivity or electrical conductivity. Note that the abovementioned phosphors and these fillers may be used in combination, and in order to improve dispersibility in silicone layers, the surface of the particulate components of these phosphors may be surface treated using a compound selected from alkoxy silanes, organohalosilanes, organosilazanes, siloxane oligomers, etc.

The laminate is provided with a structure in which a solid layer consisting of a solid silicone material formed from the curable composition according to the present invention is disposed on a release layer, and particularly suitably, further provided with a phosphor layer which is a silicone layer different from the solid layer and contains a phosphor, etc. When the solid layer formed from the solid silicone material according to the present invention is disposed on the release layer, the solid layer formed from the solid silicone material according to the present invention, or a laminate member containing the same can be easily separated from the release layer forming the laminate, wherein the separated laminate member itself can be used as an optical member, etc. to manufacture another structure.

<Laminate with Light Source and Phosphor, Light Emitting Device>

The solid layer formed from the solid silicone material obtained by the curable composition according to the present invention can be disposed at the interface with the air; when the solid layer is disposed on the light source of the light emitting diode (LED) or organic electroluminescence element (OLED), the solid layer formed from the solid silicone material according to the present invention can be disposed at the interface with air to improve the light extraction efficiency of the overall laminate comprising the light source. Such a laminate particularly preferably has a phosphor layer containing the same phosphor as described above as the wavelength conversion material of the light source, and particularly preferably has a silicone layer containing a phosphor. Here, the light emitted from the light source is preferably disposed at a position that is wavelength converted by a phosphor layer and reaches a solid layer made from the solid silicone material according to the present invention disposed at the interface with the air; the solid layer formed from the solid silicone material according to the present invention may be formed over a portion or the whole of the phosphor layer, or may be disposed outside the phosphor layer via the functional layer of another laminate. The overall thickness of these laminates is not particularly limited, but is preferably 1 μm or more, and in the case of a light emitting device, etc., may be within a range of 50 to 10,000 μm, and is particularly preferably within a range of 100 to 1,000 μm.

<Improvement in Light Extraction Efficiency and Improvement in Heat Resistance>

The laminate provided with the light source and the phosphor layer is a light emitting device such as a light emitting diode (LED) or organic electroluminescence element (OLED), and the arrangement consisting of the light source, the phosphor layer, and the solid layer formed from the solid silicone material according to the present invention can improve the light extraction efficiency of the light emitting device. Further, the use of a solid layer made from a solid silicone material according to the present invention can prevent coloring, etc. which occurs due to the heat generation of the light emitting device etc. compared with the use of a different material, such that the heat resistance of the light emitting device may be particularly improved.

[Manufacturing Method of Laminate]

The manufacturing method of the laminate containing the cured product obtained by the curable organopolysiloxane composition according to the present invention is not particularly limited, but the method is preferably a method comprising the steps of any of the following steps (i) to (iii). Note that the coating method, etc. used in the step is not particularly limited, but examples thereof include the methods described in the method for manufacturing a film-like or sheet-like material formed from the cured product obtained by the curable composition according to the present invention described above.

(i) A step in which, when the solid silicone material obtained by curing the curable organopolysiloxane composition according to the present invention includes hot melt properties, the solid silicone material is formed into a film or sheet or thin film from on another structure;

(ii) A step of dispersing the curable organopolysiloxane composition according to the present invention in an organic solvent, coating the composition in a film or thin film form on another structure, and then removing the organic solvent to cure the composition; and (iii) A step of laminating another structure on a film-like or sheet-like material made from a solid silicone material obtained by curing the curable organopolysiloxane composition according to the present invention.

Here, when the thickness of the film material is thin, this may be referred to as a thin film material.

In particular, the solid silicone material obtained by curing the curable composition according to the present invention can be handled in the form of a laminate capable of releasing the solid silicone material from the substrate, wherein the solid layer formed from the solid silicone material according to the present invention or the laminate member containing the same can be easily separated from the release layer of the substrate and used. A solid layer formed from the solid silicone material according to the present invention (released from the release layer) or a laminate member containing the solid layer is itself suitably used as an optical member, etc. to manufacture other structures such as optical devices or members thereof. Therefore, a manufacturing method comprising each of the following steps is particularly preferably the method for manufacturing a laminate comprising the solid silicone material according to the present invention. In particular, another structure is preferably a precursor of a light emitting device provided with a light receiving sensor, light source, etc., and the manufacturing method is particularly preferably a method for manufacturing a light emitting device or a light receiving sensor comprising a solid layer made from the solid silicone material according to the present invention disposed at the interface with the air.

(i): A step of dispersing the curable organopolysiloxane composition according to the present invention in an organic solvent, coating the obtained liquid in a film or thin film form on a release layer of a releasable substrate, then removing the organic solvent, and curing the composition into a solid silicone material;

(ii): a step of laminating the same or a different silicone layer on the film-like or thin film solid silicone material obtained in step i;

(iii): a step of integrating the film-like or thin film solid silicone material and the silicone layer laminated thereon, which is obtained in step (ii), in addition to releasing the material and the layer from a release layer, to obtain a laminate; and (iv): laminating the laminate obtained in the step iii on another structure.

<Properties and Preferred Applications of the Solid Silicone Material Obtained by Curing the Curable Organopolysiloxane Composition According to the Present Invention>

When the curable composition according to the present invention contains components A, B, and C, and 10 mol % or more of the overall groups bonded to silicon atoms of component A are aryl groups, the hardness and mechanical properties of the solid silicone material obtained by curing the curable composition can be suitable for use as a bulk material itself which can be handled alone as a film-like or sheet-like material. Further, the curable composition according to the present invention improves the adhesion between the inorganic filler of component B and the matrix material consisting of components A and C in the resulting solid silicone material by combining components A and C with component B, wherein the breaking elongation of the solid silicone material is effectively significantly improved compared to the case in which component C is not used. By improving the breaking elongation, such effect can be obtained that the followability of the material itself to thermal deformation increases to improve the heat resistance.

The curable composition according to the present invention can be used as a coating agent on a substrate, not only as a bulk material, but also by applying a liquid (obtained by dissolving at least a portion of the component in a solvent and dispersing an inorganic filler in the solvent), removing the solvent, and curing the composition. When the cured product obtained by the curable composition according to the present invention is used as a bulk material in a film or sheet form, the thickness thereof is preferably 50 to 10,000 μm; in contrast, when it is used as a coating agent, the thickness of the coating layer formed from the solid silicone material after curing is preferably 10 to 500 μm, but is not limited to these thicknesses.

The curable composition according to the present invention is suitable as a material used as an optical member for an optical apparatus. Particularly suitable applications for the curable compositions according to the present invention include a light diffusing material for a light receiving sensor, specifically, a material of a light diffusion film or light diffusing layer disposed on the front surface of the sensor light receiver. In this case, component B is preferably spherical fused silica particles, spherical fused alumina particles, or combinations thereof. Moreover, the curable composition according to the present invention is also preferable as a material for use as an optical member for a light emitting diode (LED) or an organic electroluminescence element (OLED), for example, as a sealing agent. For this application, the abovementioned spherical fused silica particles, spherical fused alumina particles, or combinations thereof as component B may be used. Furthermore, when a wavelength conversion function is imparted to the cured product, a fluorescent filler is preferably used.

However, the application of the curable composition according to the present invention is not limited to the abovementioned applications, and can be used in any application.

Further, the solid silicone material obtained by curing the curable organopolysiloxane composition according to the present invention has high durability in the reflow soldering step, and the solid silicone material is less colored due to the same step.

EXAMPLES

The present invention will be described below by way of examples; however, the present invention is not limited to these examples. Note that hereinafter, in the descriptions and tables of the examples, an organopolysiloxane having a resin-linear polymer structure obtained by Synthesis Example 1 is abbreviated as an "RL copolymer". In addition, in the compositional formulas and structural formulas indicated below, Me is a methyl group, Ph is a phenyl group, and Vi is a vinyl group.

Note that in the present specification, the proportion (mol %) of aryl groups of organic groups bonded to silicon atoms of the organopolysiloxane is a value determined by $^{13}C$—, $^{29}Si$-NMR.

Synthesis Example 1

A 1 L four-neck round-bottom flask was filled with a phenylsilsesquioxane hydrolysate (302.50 g, 2.214 mol of Si) and propyl propionate (210.20 g). The mixture was heated at reflux for 30 minutes in a nitrogen atmosphere. The reaction mixture was cooled to 100° C., and then a propyl propionate solution of diacetoxy-terminated polyphenylmethylsiloxane (256.35 g, degree of siloxane polymerization: 112) was added. The reaction mixture was heated at reflux for two hours. Thereafter, methylvinyldiacetoxysilane (16.16 g, 0.09 mol of Si) was added, and the mixture was refluxed for one hour. Water (60 mL) was added to the mixture, and the aqueous phase was removed by azeotropic distillation. Methyltriacetoxysilane (40.59 g, 0.18 mol of Si) was added, and the mixture was refluxed for one hour. Water (60 mL) was added, and the aqueous phase was removed by azeotropic distillation. Thereafter, a 1:1 mixture of methyl triacetoxysilane and ethyl triacetoxysilane (5.07 g, 0.02 mol of Si) was further added, and the mixture was refluxed for one hour. Water (60 mL) was added, and the aqueous phase was removed by azeotropic distillation. This procedure was repeated two more times to reduce the acetic acid concentration, and some of the propyl propionate was further distilled off to obtain a propyl propionate solution of an organopolysiloxane (RL copolymer) having a transparent resin-linear polymer structure (weight average molecular weight of the polymer: 85,600, solid content concentration: 71.16%).

Regarding the organopolysiloxane prepared in Synthesis Example 1 (RL copolymer), approximately 60 mol % of the organic groups bonded to the silicon atom is a phenyl group.

<Preparation of Liquid A>

An organohydrogensiloxane resin (2.37 g) represented by the compositional formula: $(HMe_2SiO_{1/2})_{0.60}(PhSiO_{3/2})_{0.40}$, as well as divinylsiloxane complex of platinum, in an amount of 1 ppm in terms of platinum content, was added to the propyl propionate solution of the RL copolymer obtained in Synthesis Example 1 (solid content concentration: 71.6%, 139.7 g) and stirred using mechanical force to obtain a solution A.

Regarding the organopolysiloxane in liquid A, approximately 60 mol % of the total organic group bonded to the silicon atom is a phenyl group.

<Preparation of Liquid B>

A terminal vinyl organotetrasiloxane (2.4 g) represented by the structural formula: $(ViMe_2SiO)_3SiPh$, as well as a divinyl disiloxane complex of platinum in an amount of 2.5 ppm in terms of platinum content, was added to a mixture of: 52.5 g and 20.1 g of vinyl group-containing organopolysiloxane resins respectively represented by the compositional formulae: $(Me_2SiO)_{0.10}(MeViSiO)_{0.15}(PhSiO_{3/2})_{0.75}$ and $(Me_2ViSiO_{1/2})_{0.25}$ $(PhSiO_{3/2})_{0.75}$; a both-terminal SiH organohydrogen trisiloxane (23 g) represented by the structural formula: $HMe_2SiOPh_2SiOSiHMe_2$; and an organohydrogen siloxane resin (2 g) represented by the compositional formula: $(HMe_2SiO_{1/2})_{0.60}(PhSiO_{3/2})_{0.40}$, and uniformly stirred using mechanical force to obtain liquid B.

Regarding the organopolysiloxane in liquid B, approximately 20 mol % of the total organic group bonded to the silicon atom is a phenyl group.

Hereinafter, the average thicknesses of the sheet-like cured products in the examples and comparative examples were measured using a film thickness meter (DIGIMICRO MFC-101A, manufactured by Nikon).

The additives used in the following examples and comparative examples are as follows.

Additive 1: Compound represented by the structural formula $(Me_2ViSiO_{1/2})(Me_2SiO)_3((MeO)_3SiO_{1/2})$ Additive 2: Compound represented by the average structural formula $(Me_2ViSiO_{1/2})(Me_2SiO)_{25}((MeO)_3SiO_{1/2})$ Additive 3: Dodecyltrimethoxysilane Additive 4: Gamma-glycidoxypropyltrimethoxysilane Additive 5: Cyclic oligosiloxane represented by the composition formula $(MeViSiO)_n$ Additive 6: Vinylpolyphenyl methylsiloxane at both terminals represented by the average structural formula $(Me_2ViSiO_{1/2})_2(MePhSiO)_{23}$ Additive 7: Cyclic oligosiloxane represented by the composition formula $(MePhSiO)_n$ Additive 8: Composition formula $(Me_2ViSiO_{1/2})_{0.146}(Me_2RSiO_{1/2})_{0.291}(PhSiO_{3/2})_{0.563}$ (wherein R represents a gamma-glycidoxypropyl group)

Additive 9: Allyltrimethoxysilane

Additive 10: Vinyltrimethoxysilane

The fillers used in the following examples, reference examples, and comparative examples are as follows. Note that the following average particle size ($d_{50}$) is a value measured by a Coulter method or a laser diffraction scattering method.

Filler I: spherical fused silica particles FB-3SDC having an average particle size of 3 μm available from Denka Company Limited.

Filler II: spherical alumina particles CB-P05 having an average particle size of 5 μm available from Showa Denko K.K.

Filler III: YAG type yellow phosphor NYAG4454-S having an average particle size of 8 μm available from Intematix Corporation Filler IV: spherical fused silica particles FB-5SDC having an average particle size of 5 μm available from Denka Company Limited.

Filler V: non-spherical titanium oxide particles SX-3103 having an average particle size of 0.2 μm available from Sakai Chemical Industry Co., Ltd.

[Method 1 for Making a Cured Product]

The amount of the filler indicated in the table below was added to abovementioned liquid A, an appropriate amount of a propyl propionate solvent was added thereto, and the mixture was uniformly stirred using mechanical force while degassing under reduced pressure to obtain each preparation. The obtained preparation solution was cast on a SPPET75D13BU PET film (release film) manufactured by PANAC Corporation using a coating machine (PI-1210 FILM COATER) with a gap of 210 μm, and then dried for 30 minutes in an oven set to 70° C. to obtain a sheet-like composition. Here, the average thickness of the obtained sheet was 80 μm. This sheet was overlaid and vacuum pressure bonded using a 1 mm thick mold using a vacuum press at 50° C., and then cured by heating for 15 minutes in a press at 125° C., then for one hour in an oven at 150° C. to produce a 1 mm thick resin sheet.

[Method 2 of Making a Cured Product]

The amount of the filler indicated in the table below was added to abovementioned liquid B, and the mixture was uniformly stirred using mechanical force while degassing under reduced pressure to obtain each preparation. The obtained preparation liquid was heated for 15 minutes in a 125° C. press using a 1 mm thick mold, and then heated for 1 hour in an oven at 150° C. to form a resin sheet.

Example 1 to 13, Reference Examples 1 to 3, and Comparative Example 1 to 9: Filler-Containing Resin Sheet According to the formulations indicated in Table 1 and Table 2, the curable organopolysiloxane composition was prepared by adding an additive and a filler to the abovementioned liquid A using the RL copolymer prepared in Synthesis Example 1 or the abovementioned liquid B, the resin sheet was created from the curable composition according to the method for creating the abovementioned cured product, and the properties thereof were evaluated by the following methods. Note that the values listed in the fields of the materials used in Example 1 to 13, Reference Example 1 to 3, and Comparative Example 1 to 9 indicated in Tables 1 and 2 indicate parts by weight of each of the materials used.

The breaking strength and elongation properties at break of the resin sheets made in each example, reference example, and comparative example were determined as follows. Samples having a sample thickness of 1 mm were cut from the resin sheet using a super dumbbell cutter SDK-300-D (available from DUMBBELL CO., LTD.) in accordance with JIS K-6251-3 to obtain a determination sample. The determination sample was determined for breaking strength and breaking elongation at a tensile rate of 15 mm/min using an Autograph AGS-X available from Shimadzu Corporation, equipped with a 1 kN load cell.

Further, the fracture surface of the sample obtained by determining the breaking strength described above was observed with an SEM. SEM observation of the fracture surface was carried out using an SEM TM4000PLUS Microscope (available from Hitachi, Ltd.) at 8000 fold magnification. When the material was released and broken from the surfaces of the filler particles and/or the vicinity of the surfaces of the filler particles, it was regarded as interfacial release; in contrast, when the cured organopolysiloxane polymer matrix broke at a distance from the surfaces of the filler particles or the immediate vicinity thereof, it was regarded as cohesive failure.

The results are indicated in Tables 1 and 2 below.

TABLE 1

| | Reference Example 1 | Example 1 | Example 2 | Example 3 | Example 4 | Example 5 | Example 6 |
|---|---|---|---|---|---|---|---|
| Liquid B | 40 | 39.92 | 39.8 | 39.6 | 39.98 | 39.92 | 39.8 |
| Additive 1 | | 0.2 | 0.2 | 1 | | | |
| Additive 2 | | | | | 0.1 | 0.2 | 0.6 |
| Additive 3 | | | | | | | |
| Additive 4 | | | | | | | |
| Additive 5 | | | | | | | |
| Additive 6 | | | | | | | |
| Filler I | 60 | 59.88 | 59.7 | 59.4 | 59.94 | 59.88 | 59.7 |
| Total | 100 | 100 | 100 | 100 | 100 | 100 | 100 |
| Breaking strength, MPa | 20.3 | 19.6 | 19.5 | 18.1 | 19.9 | 18.5 | 19.0 |
| Elongation % at break | 5.2 | 7.3 | 7.8 | 8.4 | 6.5 | 7.1 | 8.2 |
| Main failure mode | Interfacial peeling | Cohesive failure | Cohesive failure | Cohesive failure | Cohesive failure | Cohesive failure | Cohesive failure |

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Liquid B | 39.92 | 39.8 | 39.92 | 39.8 | 39.96 | 39.8 | 39.8 |
| Additive 1 | | | | | | | |
| Additive 2 | | | | | | | |
| Additive 3 | 0.2 | 0.6 | | | | | |
| Additive 4 | | | 0.2 | 0.5 | | | |
| Additive 5 | | | | | 0.1 | 0.5 | |
| Additive 6 | | | | | | | 0.5 |
| Filler I | 59.88 | 59.7 | 59.88 | 59.7 | 59.94 | 59.7 | 59.7 |
| Total | 100 | 100 | 100 | 100 | 100 | 100 | 100 |
| Breaking strength, MPa | 16.7 | 15.7 | 18.4 | 19.6 | 18.3 | 19.9 | 9.2 |
| Elongation % at break | 4.9 | 3.9 | 5.7 | 6.8 | 5.6 | 4.7 | 3.6 |
| Main failure mode | Interfacial peeling | Interfacial peeling | Interfacial peeling | Cohesive failure | Cohesive failure | Cohesive failure | Interfacial peeling |

TABLE 2

| | Reference Example 2 | Example 7 | Reference Example 3 | Example 8 | Comparative Example 8 | Reference Example 4 |
|---|---|---|---|---|---|---|
| Amount excluding solvent in liquid A | 30 | 29.85 | | | | |
| Liquid B | | | 40 | 39.8 | 39.8 | 40 |
| Additive 1 | | 0.5 | | 0.5 | | |
| Additive 7 | | | | | 0.5 | |
| Additive 8 | | | | | | |
| Additive 9 | | | | | | |
| Additive 10 | | | | | | |

TABLE 2-continued

| | | | | | | |
|---|---|---|---|---|---|---|
| Filler I | | | | | | 50 |
| Filler II | 70 | 60.65 | | | | 10 |
| Filler III | | | 60 | 59.7 | 59.7 | |
| Total | 100 | 100 | 100 | 100 | 100 | 100 |
| Breaking strength, MPa | 4.4 | 3.7 | 11.5 | 1.0 | 9.6 | 17.6 |
| Elongation % at break | 36.0 | 44.0 | 1.9 | 7.4 | 2.4 | 3.7 |
| Main failure mode | Interfacial peeling | Cohesive failure | Interfacial peeling | Cohesive failure | Interfacial peeling | Interfacial peeling |
| | Example 9 | Example 10 | Example 11 | Example 12 | Example 13 | Comparative Example 9 |
| Amount excluding solvent in liquid A | | | | | | |
| Liquid B | 39.88 | 39.84 | 39.8 | 39.8 | 39.8 | 39.8 |
| Additive 1 | | | | | | |
| Additive 7 | | | | | | |
| Additive 8 | | | | 0.5 | | |
| Additive 9 | | | | | 0.5 | |
| Additive 10 | | | | | | 0.5 |
| Filler I | 49.85 | 49.8 | 49.75 | 49.75 | 49.75 | 49.75 |
| Filler II | 9.97 | 9.96 | 9.95 | 9.95 | 9.95 | 9.95 |
| Filler III | | | | | | |
| Total | 100 | 100 | 100 | 100 | 100 | 100 |
| Breaking strength, MPa | 18.0 | 17.0 | 18.8 | 18.4 | 17.6 | 6.8 |
| Elongation % at break | 5.1 | 5.3 | 5.8 | 7.0 | 7.5 | 33.0 |
| Main failure mode | Cohesive failure | Cohesive failure | Cohesive failure | Cohesive failure | Cohesive failure | Interfacial peeling |

Moreover, SEM photographs of the fracture surfaces after determining the breaking strength of the test samples of Example 2 and Comparative Example 4 are indicated in FIGS. 1 and 2.

FIG. 1 is an SEM photo indicating the fracture surface of the sample of Example 2.

FIG. 2 is an SEM photo indicating the fracture surface of the sample of Comparative Example 4.

In the test sample of Example 2 indicated in FIG. 1, it was observed that the surfaces of the filler particles found on the fracture surface were irregular and not smooth and that the surfaces of the filler particles were covered with the cured organopolysiloxane polymer.

In contrast, the test sample of Comparative Example 4 indicated in FIG. 2 shows that the surfaces of the filler particles found on the fracture surface were smooth and not covered by the cured organopolysiloxane polymer and that releasing occurred at the interface between the filler particles and the organopolysiloxane polymer.

Summary of Reference Example 1, Examples 1 to 6, and Comparative Examples 1 to 7

Compared with the filler composition not containing the additive of Reference Example 1, the filler and the organopolysiloxane matrix were integrated by containing additives 1 or 2 of component C according to the present invention in Example 1 to 6, the matrix was released from the filler interface to inhibit the material from breaking, and the elongation properties at break of the material improved from 5% to 7 to 8% without changing the breaking strength so much (18 to 20 MPa). In contrast, when the curable composition does not contain component C and when a compound having a structure different from that of component C according to the present invention is used as an additive, the filler surface and the siloxane matrix cannot make a strong bond; consequently, the breaking elongation does not change much compared to the case in which no additive is used, but rather, a reduction in breaking strength occurs and toughness is inferior to that of the cured product according to the present invention.

Summary of Reference Example 2 and Example 7

Compared with the formulation not containing the additive of Reference Example 2, the filler and organopolysiloxane matrix were strongly bonded and integrated in the obtained cured product by containing additive 1 corresponding to component C according to the present invention in the formulation of Example 7, the matrix was released from the filler interface to inhibit the material from breaking, and the elongation properties of the cured product improved from 36% to 44% without changing the breaking strength so much (approximately 4 MPa).

Summary of Reference Example 3, Example 8, and Comparative Example 8

Compared with the composition not containing the additive of Reference Example 3 but containing a phosphor as a filler, the filler and organopolysiloxane matrix were strongly bonded and integrated by containing additive 1 corresponding to component C according to the present invention in Example 8, the matrix was released from the filler interface to inhibit the material from breaking, and the elongation properties of the material improved from approximately 2% to approximately 7% with respect to Reference Example 3 without changing the breaking strength so much (approximately 10 MPa). In contrast, when the additive used had a structure different from component C (Comparative Example 8), strong bonds were not capable of being formed between the filler surface and the organopolysiloxane matrix, such that the breaking elongation was almost unchanged compared to Reference Example 3, which did not include an additive.

Summary of Reference Example 4, Examples 9 to 13, and Comparative Example 9

Compared with the composition not containing the additive of Reference Example 4 but being used by mixing two types of filler, the filler and organopolysiloxane matrix were strongly bonded and integrated by containing additive 1, 8, or 9 corresponding to component C according to the present invention in Example 9 to 13, the matrix was released from the filler interface to inhibit the material from breaking, and the elongation properties of the material improved from 3.7% to approximately 5 to 7% with respect to Reference Example 4 without changing the breaking strength so much (approximately 17 to 18 MPa). In contrast, in Comparative Example 9 in which vinyl trimethoxysilane different from the structure of component C was used as an additive, the carbon chain of the reactive group on the silicon atom was short, such that the filler surface and the organopolysiloxane matrix were not able to form a bond; rather, the terminal functionality of the organopolysiloxane matrix polymer was blocked by vinyltrimethoxysilane, thereby causing inadequate crosslinking between the organopolysiloxane molecules, so it was thereby presumed that the breaking strength of the material decreased and became soft to cause elongation, leading to a failure to achieve the inherent intended hardness of the material.

Comparison Test of Changes in the Transmittance of Samples of Reference Example 1 and Example 1 by Heating A 300 μm thick sheet was made using a curable composition having the same composition as in Reference Example 1 and Example 1. The light transmittance of these sheets was determined by attaching a 150 mmφ integrating sphere unit to a V770 ultraviolet visible near-infrared spectrophotometer available from JASCO Corporation. Then, upon heat treating each sheet with a program having a temperature of 280° C. or higher and 10 seconds after holding each sheet for 3 minutes at 160 to 200° C. using a reflow apparatus RDT-165 CP available from MALCOM COMPANY LIMITED, in the sheet made from the material of the composition of Reference Example 1, a reduction of approximately 2% in transmittance by releasing the organopolysiloxane matrix from the filler surface was observed at a wavelength of approximately 500 nm or less, while a reduction in transmittance was not particularly observed for sheets made from the material of the composition of Example 1.

This result shows that the use of component C as an additive in addition to components A and B used in the present invention is an effective means for improving thermal shock as well as mechanical shock, by pulling, etc.

Evaluation of Film Samples; Reference Example 5 and Example 14 to 22

Preparation of a Film Sample Having a Thickness of 100 μm or Less

The amount of the filler indicated in Table 3 below was added to abovementioned liquid A, an appropriate amount of a propyl propionate solvent was added thereto, and the mixture was uniformly stirred using mechanical force while degassing under reduced pressure to obtain each preparation.

The obtained preparation liquid was applied using a spin coater onto a cover glass 24×60×0.13-0.17 mm available from Matsunami Glass Ind., Ltd., then heated for one hour in an oven at 150° C. to create a cured product.

Preparation of a Film Sample Having a Thickness of 200 μm or More

The amount of the filler indicated in Table 3 below was added to abovementioned liquid B and the mixture was uniformly stirred using mechanical force while degassing under reduced pressure to obtain each preparation.

The obtained preparation liquid was heated for 15 minutes in a 125° C. press using a mold having a thickness indicated in Table 3, then heated for one hour in an oven at 150° C. to create a cured product.

<Determination of Light Transmission Diffusion of the Film Sample>

Light transmission diffusion determination of film samples made by the abovementioned method described above was carried out using a Genesia Gonio/Far Filed Profiler available from Genesia Corporation; wherein, using the 45 degrees of the bidirectional transmittance distribution function, when the transmitted light intensity of light incident perpendicular to the determination sample surface, that is, the linear transmitted light intensity was 1, and when the light receiving intensity at a position in which the light receiving unit was inclined by 45 degrees relative to the incident optical axis of the determination sample was 0.65 or more, it was regarded as a good light diffusing material (the results were indicated as ○ in Table 3); in contrast, when the light receiving intensity was less than 0.65, the results were indicated as x.

The visible ultraviolet spectral properties of the film samples described above were determined by attaching a 150 mmφ integrating sphere unit to a V770 ultraviolet visible near-infrared spectrophotometer available from JASCO Corporation.

A light transmittance of higher than 40% within a range of 380 to 720 nm was determined to be good (results are indicated as o in Table 3), while those with a light transmittance of less than 40% were determined to be poor (results are indicated as x in Table 3).

The heat resistance of the abovementioned film sample was heated for three minutes at 160 to 200° C. using a reflow apparatus RDT-250C available from MALCOM COMPANY LIMITED, rapidly heated, retained at 260° C. or higher for 10 seconds, and then cooled. After this operation was repeated three times, the light transmittance of the sample was determined according to the abovementioned method, with a reduction in transmittance of less than 2% within a range of the visible light range (380 to 740 nm) regarded as good heat resistance (the results are indicated as o in Table 3).

TABLE 3

| | Examples | | Reference Example | Examples | | | | | | |
|---|---|---|---|---|---|---|---|---|---|---|
| | 14 | 15 | 5 | 16 | 17 | 18 | 19 | 20 | 21 | 22 |
| Amount excluding solvent in liquid A | 19.8 | 9.9 | | | | | | | | |
| Liquid B | | | 99 | 49.5 | 39.6 | 29.7 | 29.7 | 59.4 | 49.5 | 39.6 |
| Additive 1 | 0.2 | 0.1 | 1 | 0.5 | 0.4 | 0.3 | 0.3 | 0.6 | 0.5 | 0.4 |
| Filler I | 80 | | | 50 | 60 | | 30 | | 49.99 | 50 |
| Filler II | | 90 | | | | | | 40 | | 10 |
| Filler IV | | | | | | 70 | 40 | | | |
| Filler V | | | | | | | | | 0.01 | |
| Shore D hardness | 70 | — | 70 | 80 | 83 | 86 | 89 | 75 | 80 | 85 |
| Thickness (μm) | 100 | 40 | 300 | 200 | 200 | 300 | 200 | 200 | 200 | 200 |
| Diffusion performance according to the 45 degree bidirectional transmittance distribution intensity ratio | ○ | ○ | x | ○ | ○ | ○ | ○ | ○ | ○ | ○ |
| Transmittance >40% (380 to 720 nm) | ○ | ○ | ○ | ○ | ○ | ○ | ○ | ○ | ○ | ○ |
| Heat resistance | ○ | ○ | ○ | ○ | ○ | ○ | ○ | ○ | ○ | ○ |

Summary of Reference Example 5 and Example 14 to 22

For Examples 14 and 15, good light diffusion films having a thicknesses of 100 and 40 μm, respectively, were created. Reference Example 5 did not contain a prescribed filler and had poor diffusion properties. In Example 16 to 22, good light transmittance and light diffusion properties were exhibited in various types and amounts of filler. In this example, when titanium oxide (filler V), which is a small amount of light diffusing reflective particles, was placed in Example 21, the 45 degree bidirectional transmittance distribution intensity ratio of 0.66 in Example 16 was further improved to 0.68 in Example 21.

From the above results, it can be seen that the cured product obtained by the curable organopolysiloxane composition according to the present invention has excellent light transmittance, light diffusion properties, and mechanical properties and is useful as a light diffusing material.

The invention claimed is:

1. A curable organopolysiloxane composition, comprising the following components A) to C) and a curing catalyst to accelerate a curing reaction involving reactive groups of components A) and C):

A) an organopolysiloxane component;

B) one or more inorganic fillers selected from the group consisting of spherical silica particles, spherical alumina parts, and fluorescent fillers;

C) an organosilicon compound represented by the following formula:

$$Vi(CH_3)_2Si—(OSi(CH_3)_2)_{n1}—OSi(OCH_3)_3$$

wherein Vi represents a vinyl group and n1 is 1 to 50; wherein the mass of component B) is 30 to 95% relative to the mass of the overall composition; and wherein component A) comprises the following components A1) and A2):

A1) a straight chain or branched chain organopolysiloxane, which is different from component A2);

A2) an organopolysiloxane having a resin linear structure and comprising i) to iii) as follows:

i) T units represented by $R^{Ar}SiO_{3/2}$, where $R^{Ar}$ represents an aryl group having 6 to 14 carbon atoms;

ii) a resin structure block having $R^{72}SiO_{3/2}$ units, where $R^{72}$ represents a radical reactive group or a hydrosilylation reactive group;

iii) a straight chain diorganopolysiloxane structure part represented by $(R^{71}{}_2SiO_{2/2})_{n2}$, where each $R^{71}$ is an alkyl group having 1 to 20 carbon atoms, which may be substituted with halogen atoms, or an aryl group having 6 to 14 carbon atoms, which may be substituted with halogen atoms, and n2 represents a number within a range of 3 to 1000;

wherein the reactive groups are capable of cross-linking via a radical reaction and/or a hydrosilylation reaction and the proportion of aryl groups having 6 to 14 carbon atoms in the total number of moles of $R^{Ar}$, $R^{71}$ and $R^{72}$ groups, but excluding hydroxyl groups, is 10 mol % or more.

2. The curable organopolysiloxane composition according to claim 1, wherein component A1) is a straight chain organopolysiloxane.

3. The curable silicone composition according to claim 1, wherein a linking part between the resin structure block of component A2) and the straight chain diorganopolysiloxane structure part of component A2) is an —Si—O—Si— bond, an —Si—$R^A$—Si— group where $R^A$ represents a straight chain or branched chain alkylene group having 2 to 14 carbon atoms, or combinations thereof.

4. The curable organopolysiloxane composition according to claim 1, wherein the spherical silica particles are spherical fused silica particles, while the spherical alumina particles are spherical fused alumina particles.

5. The curable organopolysiloxane composition according claim 1, wherein n1 of the general formula of component C) is 2 to 30.

6. The curable organopolysiloxane composition according to claim 5, wherein n1 of the general formula of component C) is 3 to 25.

7. A cured product, obtained by the curable organopolysiloxane composition according to claim 1.

8. The cured product according to claim 7, wherein the light transmittance is 40% or more.

9. The cured product according to claim 7, wherein in a bidirectional transmittance distribution function using a white light source, when the linear transmitted light intensity is 1, the transmitted light intensity at a light receiving position inclined by 45 degrees with respect to the linear transmitted light with a determination sample at its center is 0.65 or more.

10. The cured product according to claim 7, wherein compared to a cured product obtained by a curable organopolysiloxane composition having the same components except for component C), the breaking elongation of the cured product increases by 10% or more.

11. An optical member, comprising the cured product according to claim 7.

12. The optical member according to claim 11, wherein the optical member is a light diffusion film for a light receiving sensor.

13. The optical member according to claim 11, wherein the optical member is a sealing agent for a light emitting diode or organic electroluminescence element.

14. An optical apparatus comprising the optical member according to claim 11.

15. The curable organopolysiloxane composition according to claim 1, wherein component B) is a fluorescent filler.

16. The curable organopolysiloxane composition according to claim 1, wherein at least 20 mol % of the overall organic groups bonded to silicon atoms in component A) are aryl groups.

* * * * *